United States Patent
Shin et al.

(10) Patent No.: US 10,697,056 B2
(45) Date of Patent: Jun. 30, 2020

(54) METHODS OF FORMING ROTARY SPUTTERING TARGET

(71) Applicant: Vital Thin Film Materials (Guangdong) Co., Ltd., Qingyuan (CN)

(72) Inventors: Jong-Won Shin, Providence, RI (US); Nikolaus Margadant, Providence, RI (US)

(73) Assignee: Vital Thin Film Materials (Guangdong) Co., Ltd., Qingyuan, Guangdong (CN)

( * ) Notice: Subject to any disclaimer, the term of this patent is extended or adjusted under 35 U.S.C. 154(b) by 357 days.

(21) Appl. No.: 15/558,388

(22) PCT Filed: Mar. 17, 2016

(86) PCT No.: PCT/EP2016/055780
§ 371 (c)(1),
(2) Date: Sep. 14, 2017

(87) PCT Pub. No.: WO2016/146733
PCT Pub. Date: Sep. 22, 2016

(65) Prior Publication Data
US 2018/0051371 A1    Feb. 22, 2018

Related U.S. Application Data

(60) Provisional application No. 62/134,807, filed on Mar. 18, 2015, provisional application No. 62/134,762, filed on Mar. 18, 2015.

(51) Int. Cl.
*C23C 14/34* (2006.01)
*H01L 33/32* (2010.01)
(Continued)

(52) U.S. Cl.
CPC ............ *C23C 14/3414* (2013.01); *B22F 3/04* (2013.01); *B23K 1/002* (2013.01); *C01G 51/42* (2013.01);
(Continued)

(58) Field of Classification Search
CPC .. C23C 14/3414; B23K 1/002; H01J 37/3491; B22F 3/04; C01G 51/42; C01P 2004/53
(Continued)

(56) References Cited

U.S. PATENT DOCUMENTS 8,110,849 B2 *   2/2012  Shim .................. H01L 33/14
                                                  257/103
2007/0074969 A1   4/2007  Simpson et al.
(Continued)

FOREIGN PATENT DOCUMENTS

JP    2012140658 A    7/2012
JP    2015036431 A    2/2015
(Continued)

OTHER PUBLICATIONS

International Search Report for PCT/EP2016/055780, dated May 4, 2016 in English Language.
(Continued)

*Primary Examiner* — Quang T Van
(74) *Attorney, Agent, or Firm* — Yue (Robert) Xu; Apex Attorneys at Law, LLP

(57) ABSTRACT

Disclosed is a method for producing rotary sputtering target assemblies that are bonded to a suitable backing support. The bonding between the sputtering target body and the backing support is achieved by controlled heating under a suitable temperature, preferably with the help of conductive layer between the induction heater and internal target body that is inductively heated in a manner that enhances axial and radial gradient heating. A non-adhesive protective wrap
(Continued)

can also be placed at the target body such as between the conductive wrap and target body.

34 Claims, 13 Drawing Sheets

(51) Int. Cl.
    *C25B 11/04*     (2006.01)
    *B23K 1/002*     (2006.01)
    *H01J 37/34*     (2006.01)
    *B22F 3/04*     (2006.01)
    *C01G 51/00*     (2006.01)

(52) U.S. Cl.
    CPC ...... *H01J 37/3491* (2013.01); *C01P 2004/53* (2013.01)

(58) Field of Classification Search
    USPC ............ 219/609, 148, 121.14, 121.64; 204/298.13, 298.12, 298.09; 148/438; 164/113, 147, 98; 257/103, 85, 90, 200, 257/615, 745
    See application file for complete search history.

(56) References Cited

U.S. PATENT DOCUMENTS

| 2011/0089030 A1* | 4/2011 | Juliano | B22D 11/0614 |
| | | | 204/298.13 |
| 2013/0118898 A1 | 5/2013 | Shin et al. | |
| 2014/0124365 A1 | 5/2014 | Wurczinger et al. | |

FOREIGN PATENT DOCUMENTS

| JP | 2016176147 A | 10/2016 |
| JP | 2017141515 A | 8/2017 |

OTHER PUBLICATIONS

First Office Action dated Feb. 17, 2020 for Japanese patent application No. 2017-548999, English translation provided by Global Dossier.

* cited by examiner

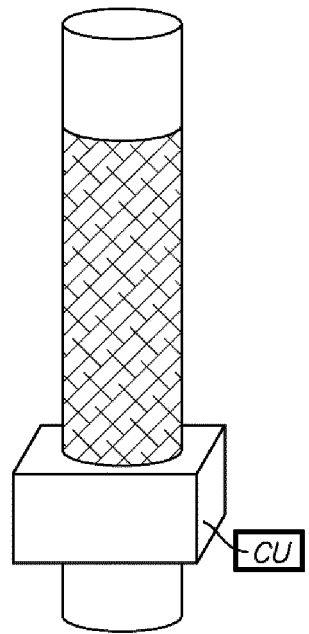 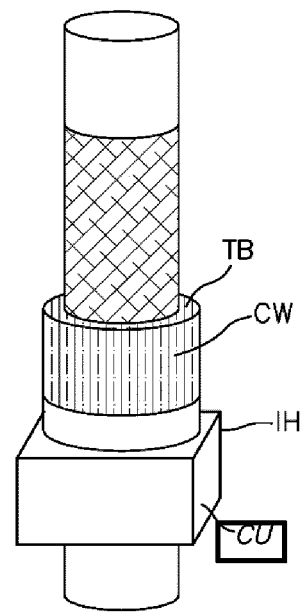
FIG. 12          FIG. 13
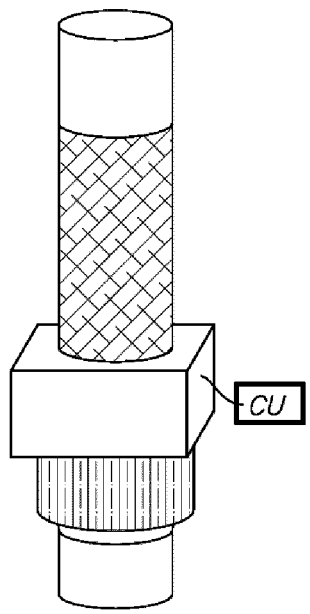 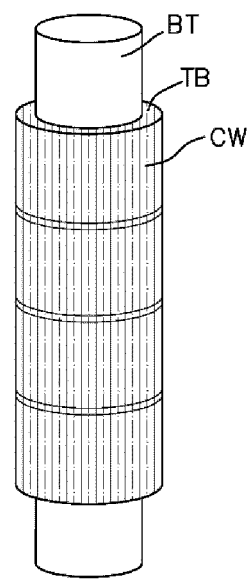
FIG. 14          FIG. 15

METHODS OF FORMING ROTARY SPUTTERING TARGET

FIELD OF THE INVENTION

The present invention relates to methods of producing rotary sputtering target assemblies and rotary sputtering target assemblies produced with such methods.

BACKGROUND OF THE INVENTION

Sputtering target assemblies are used in the formation of a wide variety of products. Some typical substrates on which the target material of sputtering target assemblies is deposited include items such as semiconductor devices, compact discs (CDs), hard disks for use in magnetic disk drives, solar cells, optical devices such as flat panel displays, and non-aqueous lithium secondary batteries.

A typical sputtering apparatus, such as one used in the production of the above described items, comprises a vacuum chamber inside of which are positioned the sputtering target assembly and the substrate. The target of the target assembly is electrically configured to be an electrode with a large ion flux. An inert gas, often in conjunction with a reactive gas, is introduced into the chamber and ionizes when power is supplied to the target/electrode. The positively charged inert gas ions collide with the target causing atomic sized particles to be ejected from the target. The particles are then deposited on the surface of the substrate as a thin film.

Because of this electrical configuration, the target can become very hot and needs to be cooled. In a typical sputtering apparatus, the cooling is provided by a water-cooled backing member to which the target is attached by an attachment layer. In some sputtering systems, a rectangular target and backing plate are used, while in other systems, the target and backing support are cylindrical in shape.

A trend in the manufacturing of flat panel displays and other devices such as those described above is to manufacture many devices on a very large substrate, much like smaller semiconductor devices are manufactured on wafers. For example, flat panel display manufacturers would like to be able to process square or rectangular flat panel display substrates having surface areas on the order of approximately 1200 square inches (7742 square centimeters) to 6000 square inches (38,700 square centimeters) or more. Some of these large substrates are currently being processed using large rectangular sputtering targets that are indium bonded to a backing plate. However, cylindrical sputtering targets can provide advantages in terms of increased film deposition rates, a lower propensity for nodule formation, and higher target material utilization than the corresponding sputtering of planar targets. The production of rotary (e.g., cylindrical target) sputtering target assemblies that are long enough for use with substrates having large surface areas (e.g., on the order of approximately 1200 square inches or more), however, present special bonding considerations and problems (e.g., there are difficulties in both the initial manufacture of a cylindrical sputtering target assembly of, for example, 0.5 to 4 meters or more, and in the manufacture of sputtering target assemblies that are of sufficiently high enough quality to meet the increasingly more stringent standards associated with film formation).

Manufacturing methods for sputtering target assemblies include a method of molding, from raw material powder, sputtering targets (i.e., target bodies used in the sputtering target assembly) and sintering the molded body. Moreover, quality demands for sputtering targets include, for example, purity control; suitable structure (e.g., crystalline structure); appropriate grain size distribution; uniform composition distribution, and a high density. Here, the relative density means a ratio between a density of a porous material and a density of a material having the same composition in a state which has no air holes.

When the sputtering target is configured of a sintered body of a raw material powder, there are numerous factors (physical and chemical attributes) both in the production and in the use of such targets that can lead to problems. For example, such ceramic material targets can easily be broken during the formation of the sintered body, and it is difficult to manufacture a sintered body having a high density and good homogeneity constantly. The sputtering target is also placed in a harsh environment and subject to potentially degrading influences during use (again physical and chemical), and thus has to be formed in an effort to avoid such degradation during use (e.g., undesirable nodule formation, chipping, peeling, cracking, separation from its support, etc.). Moreover, the sputtering target assembly, itself, needs to be of high quality to avoid issues with debonding, uneven surfaces relative to multiple target bodies supported on a common backing, nodule formation, etc., due to lower quality attributes generated in the target assembly manufacturing process.

Because of the increased difficulty in the production of hollow cylindrical sputtering targets as they get larger, to satisfy long length requirements in sputtering target assemblies, large sputtering targets generally consist of a common backing tube on which a plurality of target bodies (or segments) are bonded, i.e., the target bodies are attached to the backing support in series (typically with some intermediate spacing) by a bonding material which can be, for example, a metal, or metal alloy, having a low melting temperature, also called a metallic solder, or any other kind of electrically and thermally conductive adhesive, such as a filled elastomer.

The function of the support is to provide for electrical power transfer, mechanical strength, and heat transfer to the cooling water, and it allows the target to be mounted in the sputtering source. As the cylindrical target bodies or segments, in the form of cylinders, are often bonded on the support by soldering, there is in most cases a mismatch in coefficients of thermal expansion between the target material and the support materials, which results in thermal stresses on the solder layer and on the interfaces between target segment and solder as well as between solder and backing body, especially during cooling down after bonding or soldering of the target, but also during usage of the target in the sputtering process. In addition there can be a volume contraction of the solder when it solidifies, which also leads to interface contraction stress.

For example, during sputtering operation the cumulative thermal and contraction stress often leads to strong and uncontrolled delamination of the solder layer from either the backing body or the target segment material or from both. Where delamination over larger surface areas occurs, heat dissipation from the target segment to the support is minimal, which leads to local overheating, provoking more uneven thermal stress and eventually cracking of the target segments during sputtering. The bonding of hollow cylindrical target segments in series along the backing tube can also lead to breakage and added rework expense. For example, there can be breakage during the initial placement of cylindrical target bodies on the backing support, particularly when there is, for instance, lacking proper wetting techniques. Poor or imprecise assembly can also lead to low quality regions on the target assembly (e.g., non-aligned outer surfaces or outer diameter surfaces, unseen increased cracking, leakage regions and/or spacing issues) that can lead to the aforementioned operational issues of cracking, nodule formation, etc.

Various techniques have been proposed for bonding targets to their support that include bonding certain types of circumferentially arranged hollow ceramic target bodies (e.g., ceramic targets such as ITO and AZO targets) relative to an interior support tube with such techniques being inclusive of the use of a metal solder binder (e.g., indium), which is provided in conjunction with radiative heating that is used to raise the temperature of the ceramic cylinder and backing tube at the time of assembly, and maintain the temperature of the combination above the melting point of the solder, as molten solder is poured into the gap formed between the target and support. This radiative heating can be accomplished with vertical clam shell heater designs.

Under such radiative heating, temperature gradients at the top and bottom can only be controlled with multi-zoned heaters that are large in size. This size limits access to the target assembly being bonded, both physically and visually, and can limit the ability of an assembler to detect, for instance, leaks of solder between segment gaps or cracked ceramic walls early enough to minimize wasted time and material due to extensive rework. The control of temperature gradients, even with multi-zone heaters, is inadequate and can lead to local hot spots and thermal shock which can contribute to the cracking of the target body and solder oxidation. Proper heating during binding of a sputtering target to its backing support is thus an example of an area relative to the problems described above that arises relative to the formation of target assemblies, that, if not addressed, can raise potential issues during the manufacture of products using sputtering target assemblies (e.g., poor quality thin film products that are formed in conjunction with an inadequately operating sputtering target assembly).

SUMMARY OF THE INVENTION

In view of the circumstances as described above, an embodiment of the present invention is directed at providing a manufacturing method for producing rotary sputtering target assemblies such as those formed of one or more hollow, cylindrical target bodies (e.g., a stack (preferably slightly spaced apart) of cylindrical shaped, target bodies or segments, such as those formed of ceramic or low conductivity metals) that is/are bonded to a suitable backing support such as a common tubular, interior, concentrically located, support tube. The present invention is inclusive of a method for bonding rotary sputtering target assemblies using inductive heating to provide the required heat to the wetting (if utilized) and binder material (which wetting and binder material can be the same or different).

The methods of the present invention are inclusive of a) providing a protective wrap that avoids adhesion deposits on the target body or bodies, b) providing a conductive wrap (e.g., a conductive layer or blanket) for use with an induction heater (particularly when the dielectric constant and magnetic permeability of the target body or the nature of the backing support makes it difficult for direct induction heating), and c) a combination involving providing both an interior protective wrap and an exterior conductive wrap relative to an induction heating process for bonding one or more target bodies to a backing support.

The present invention thus provides methods of assembling a target assembly using inductive heating that results in target assemblies that are well suited for use in a sputtering apparatus and that are directed at avoiding or alleviating difficulties such as one or more of the above described difficulties associated with target assembly manufacture and usage.

The rate of inductive heating of an object is dependent on several factors including the frequency of the induced current, the intensity of the induced current, the specific heat of the material, the magnetic permeability of the material, and the resistance of the material to the flow of current. This normally would be perceived as generating significant limitations for the use of inductive heating in target bonding shops where a variety of cylindrical ceramic materials might be involved, some with physical properties that render them generally unsusceptible to direct inductive heating. Forms of $LiMO_2$ (e.g., forms of $LiCoO_2$) are representative of such an unsusceptible ceramic.

In other words, one limitation of induction heaters is the requirement that the materials being heated have an appropriate combination of dielectric coefficient and magnetic permeability. This becomes a significant limitation for their use in target bonding shops where a variety of cylindrical target (e.g., ceramic) materials, some with relatively high resistivity values, are to be bonded. The present invention provides, however, a versatile methodology that obviates such limitations. For instance under embodiments of the present invention, instead of inductively heating a target body (e.g., a ceramic target body) directly (which can be done under the present invention when the materials involved are suitable), the target is wrapped with an inductively susceptible material which is heated, using conventional heat transfer to raise the temperature of the wrapped target body. Although a number of wraps and sleeves, including metallic and non-metallic materials are considered applicable, a wrap of a carbon-embedded woven fabric (e.g., composed of fiberglass or other ceramic fibers) provides efficient heating of the wrapped cylindrical target segment being bonded to its support (e.g., an $LiMO_2$, such as an $LiCoO_2$, cylindrical target body bonded to a metal backing tube such as one of titanium). This wrap also satisfied the desirable quality of being sufficiently flexible relative to the underlying material being wrapped as to avoid non-contact regions (and potential insulating air pockets) relative to that underlying material.

Advantageously, with appropriate adjustment of the power and frequency of the inductive heater controls, an annular inductive heating unit with dimensions allowing the wrapped hollow cylindrical target body to be surrounded by the associated coils of the inductive heating unit provides efficient heating. Additionally, a backing tube of outer diameter (OD) smaller than the internal (or inner) diameter (ID) of the target body (e.g., a sintered ceramic cylinder of, for example, $LiMO_2$) can be positioned within the hollow cylinder, and the combination heated effectively simultaneously. For example, the present invention includes a bonding technique featuring a wrapped $LiMO_2$ material cylindrical target body that is a target body formed from a Cold Isostatic Pressing CIP-densified and sintered $LiCoO_2$ ceramic cylindrical target body.

The present invention's method for forming a rotary cylindrical sputtering target assembly of one or more cylindrical target bodies, or cylindrical target segments, through use of an inductive heating technique, provides for quality bonding of target bodies such as hollow cylindrical target bodies of, for example, gallium aluminum zinc oxide (GAZO), gallium indium tin oxide (GITO), indium gallium zinc oxide (IGZO), indium zinc oxide (IZO), doped-$SnO_2$, antimony tin oxide (ATO), $LiMO_2$, $Li_3PO_4$, doped-$Li_3PO_4$, ITO, AZO, silicon, and B-doped silicon. Further, the inductive heat based bonding formation of sputtering target assemblies under the present invention is suitable for use on a variety of backing supports such as tubes of stainless steel, titanium, molybdenum, aluminum or aluminum alloys, and copper or copper alloys as a few examples.

In general, the present invention is well suited as a bonding technique in the formation of a variety of sputtering target assemblies; particularly ones where the target body (or bodies) and the backing structure have different thermal coefficients of expansion. For example, the present invention is suited for binding target bodies formed by way of a CIP-based densification and sintering target body forming process. For instance, the invention features a technique for bonding hollow cylindrical targets such as those resulting from CIP densification and sintering of molded hollow ceramic cylinders of materials such as $LiMO_2$ (e.g., $LiCoO_2$) sintered hollow cylinders. That is, the present invention features a method for forming a rotary cylindrical target comprised of one or more ceramic $LiMO_2$ (e.g., $LiCoO_2$) hollow cylindrical target bodies that represent a difficult material to form and bond (e.g., providing a sputtering target assembly that comprises a plurality of $LiMO_2$ (e.g., $LiCoO_2$) hollow cylindrical target bodies suited for use in the sputtering (e.g., with pulsed DC or other power sources such as DC, MF-AC, RF power sources) of thin films as in for the generation of thin film products such as thin film batteries).

Also, while the present invention is applicable for use in bonding a variety of types of different cylindrical target bodies such as those described above, it is also available for use in bonding a variety of differently formed target bodies (e.g., target bodies formed in formation processes other than direct use of the aforementioned CIP process, such as those involving forming techniques featuring hot pressing (HP), cold axial pressing (CAP), hot isostatic pressing (HIP); slip cast, inclusive of sintering of the molded bodies).

The invention further includes an efficient and cost effective manufacturing method for assembling a rotary sputtering target assembly comprised of one or more hollow cylindrical target bodies such as those formed of, doped or non-doped materials such as gallium aluminum zinc oxide (GAZO), gallium indium tin oxide (GITO), indium gallium zinc oxide (IGZO), indium zinc oxide (IZO), doped-$SnO_2$, antimony tin oxide (ATO), $LiMO_2$, $Li_3PO_4$, doped-$Li_3PO_4$, ITO, AZO, silicon, and B-doped silicon cylindrical sintered target body (or bodies) that is/are bonded to a tubular backing support such as a metallic tubular support. An embodiment of the present invention further includes a $LiMO_2$ (e.g., $LiCoO_2$) sputtering target assembly that is assembled from pre-formed cylindrically-shaped, sintered $LiMO_2$ (e.g., $LiCoO_2$) target bodies bonded to an internal (or inner) cylindrical tubular support (preferably a metallic tube as in one that is formed of titanium). An example of a preferred bonding material is a metal solder such as one of In or an In alloy, Sn or Sn alloys, or Ag alloys. Such alloys may include a certain amount of other metallic elements to improve wetting property and bonding strength or to reduce the melting point or as a useful contaminant component. Ti, Zn, Cu, Ni, Ga, Ce, Bi, Sb, Si, and Pb can be such elements. Such alloys can also be utilized in conjunction with a surface wetting process before the final gap filling bonding material is provided to join the backing substrate to the target body.

Embodiments of the present invention also include methods for the formation of sputtering target assemblies involving controlled heating of the binder material such as that used for wetting of surfaces of either or both of the tube support or component target body surfaces that are opposed to each other and subject to bonding. That is, the heating via induction in the present invention is suited for heating both the wetting material (if provided) as well as to maintain a suitable temperature for the binder material being supplied in the circumferential gap between one or more sputtering target bodies and the interior positioned backing support. The bonding technique of the present invention facilitates avoidance of the problems associated with other binder application heating techniques (e.g., the aforementioned radiative based heating technique). For example, under the present invention the induction heaters provide significant advantages over radiative heaters relative to the control of temperature within a rotary target assembly during its bonding. Electric frequencies and energy levels can be controlled to facilitate balanced heating axially and radially. For example, frequencies can be selected to effectively control the heating of a moderately conductive ceramic target material in the presence of a highly conductive, or at least more conductive, backing tube (e.g., a metallic backing tube). Rates of heating and cooling can be maximized while minimizing gradients with power controls provided with the inductive heating system under embodiments of the present invention. For example, there can be precisely controlled the relative heat level differentials in a bottom to top gap direction so as to achieve a desirable axial temperature gradient within the bond gap as material begins to cool under the bonding process and the induction heater focus is shifted axially relative to the one or more target bodies supported by the support backing means. This facilitates the avoidance of thermal shock or regions of uncontrolled delamination during the bonding process as there is a high degree of temperature control relative to the bonding material solidification process. Embodiments of the present invention are thus suited for providing a reduction in assembly time, as well as an avoidance of throw away defective target segments or assemblies due to undesired occurrences during the assembly process. The inductive heating device can also be made small so as to provide excellent access (e.g., physical and visual) to the assembly being heated.

Methods of the invention are inclusive of utilizing a conductive wrap for induction heating in the bonding of cylindrical targets to a backing tube, inclusive of bonding a wide variety of different dielectric constant ceramic and metallic materials inclusive of low alumina AZO cylindrical targets, doped or un-doped $Li_3PO_4$, undoped (non-doped) silicon cylindrical targets, ITO, and $LiMO_2$ (e.g., $LiCoO_2$). Each of the conductive wrap and protective wrap features of the present invention can be used as a separate embodiment or as a component of a combination that features both an induction wrap and protective wrap (the protective wrap preferably being between the target body and the conductive wrap and with each wrapped in a fashion that avoids air pocket formation below each of the wraps—e.g., essentially direct 100% contact for each of the outer two laminate wraps with respect to the entire areas of the closest underlying material surface). A combination of an interior protective wrap about which is placed an outer inductive heated conductive wrap is preferred in many instances as it provides greater freedom in choosing a conductive wrap that might otherwise stain the target body (e.g., it avoids the potential for a carbon stain on the target body from a carbon based conductive wrap). Stains of this sort can require additional removal processing as in undesirable dust generating machining.

The protective wrap is free of any adhesive material that is positioned such that it might come in contact with the cylindrical target body during heating thereof, as this also can lead to undesirable straining and additional material removal (and potential added dust generation). Thus, under embodiments of the invention, the protective wrap layer is positioned closer to the cylindrical target surface than the inductive wrap layer. For example, in a preferred embodiment the adhesive-less (at least relative to surface that can impart adhesive material staining) protective wrap is placed in direct contact with the target body being protected (e.g., full circumferential protection about the entire outer diameter exposed circumference of the target body). Further, the protective wrap is also preferably held in relative position with a tape or other retention means such as one that extends only on the non-target-body side of the protective wrap. The interior contact surface of the protective wrap (e.g., a blanketing film or wound ribbon of material) is preferably applied directly into contact with the external surface of the target body cylinder being protected. The retention or holding material placed about the exterior surface of the protective wrap layer can be any suitable holding material such as a tape (in this situation adhesive presence is acceptable for contact with the exterior of the protective film wrap) that can properly withstand the heat levels associated with heating of the target body being protected during the bonding process. Also, the protective wrap that is utilized can be one that covers in one wrapping the full axial length of the target body or a lesser axial length (e.g., a ribbon of material having a width less than the full axial length of the wrapped target body) that is wound multiple times around the target body to cover its full axial length.

Methods of the invention are thus inclusive of the bonding of cylindrical targets (e.g., of ceramic) to a backing tube using induction heating in conjunction with a protective wrap protectively wrapped about the cylindrical target body or bodies (the cylindrical targets being, for example, one of the materials described in the preceding paragraph and the preference being individualized, respective wraps relative to each target segment).

Methods of the present invention (and structural target assembly forming devices for use in carrying out target assembly manufacturing of the present invention) are inclusive of one or more induction heaters per structural target assembly forming device that is/are concentrically arranged around the exterior surface of the target body or bodies to be heated. Each induction heater preferably has an axial length (i.e., the "height" of the induction heater when oriented vertically for heating a target body arranged in a vertical stack arrangement) that is 200% or less of the axial length of a target body (minimal axial length target body if different sizes are located in the sputtering target assembly). For even greater axial temperature control, the induction heater axial length (or "height") generally corresponds (about 100%) or is of lesser axial length (e.g., 40 to 80%) than the noted individual target body.

This limited induction heater axial length relationship helps avoid the difficulties associated with radiative heating devices in the prior art, such as, the large size radiative heaters that result in difficulty in accessing the target body(ies) being bonded, both physically and visually, which can limit the ability of an assembler to detect leaks of solder between segment gaps or cracked ceramic walls early enough to minimize wasted time and material due to extensive rework. Further, by using such limited axial length (relative to the overall length of the sputtering target assembly) there can be achieved more precision heating and improved axial temperature gradient control through adjusting (including oscillating) the position of either the induction heater or the partially completed sputtering target assembly or both to alter the axial, relative relationship between the two. Also, there can be utilized a single induction heater or a plurality of serially, vertically arranged induction heaters that are each under an independent control unit or a common (but preferably individually adjustable) control unit with each induction heater preferably having the noted limited axial length with axial gaps therebetween.

In the situation where the partially completed sputtering target assembly is adjusted relative to a fixed induction heater (or heaters), there is provided a suitable axial adjustment means as in a vertically adjustable device secured to a common backing tube, and that retains the desired concentricity with the other components being bonded together (and the induction heater(s) interior cylindrical aperture itself). In the alternative scenario, the induction heating system used in the present invention is preferably inclusive of an adjustable support which provides for axial adjustment of the induction heater (or heaters together or individually) to correspond with the desired target or target bodies arranged in the sputtering target assembly that is/are intended for heat application, while maintaining sufficient concentricity. In an additional embodiment there are a plurality of spaced induction heaters that are fixed in position and a received, partially completed target assembly that is also fixed in position, and an induction heater system control unit that provides for a sequenced heating of the target bodies along the backing tube length through a sequenced running of induction heaters that are powered up and down along the length of the backing tube. In an additional embodiment, the target assembly (i.e. backing tube or backing tube with attached cylindrical target bodies) is rotated on an axis aligned with the central axis of the backing tube thereby minimizing radial gradients within the target assembly. The target assembly is rotated during heating and cooling processes, but not during the addition of indium or during cylindrical body placement around the backing tube.

Thus, through use of the induction heater of the present invention there can be avoided issues like those associated with the aforementioned prior art radiant heaters (even multi-zone radiant heaters), such as the ability to better control temperature gradients along the length and circumference of the target body being heated and the avoidance of local hot spots which can contribute to the cracking of the ceramic and solder oxidation.

Induction heaters also offer significant advantages over radiative heaters for the control of temperature within a rotary target assembly during its bonding. Electric frequencies and energy levels are easily controlled to facilitate balanced heating axially and radially relative to the materials involved in the sputtering target being assembled. For example, frequencies can be tuned to effectively control the heating of a moderately conductive ceramic target material (such as those referenced above) in the presence of a highly conductive, metallic backing tube. Rates of heating and cooling can be maximized while maintaining desired axial gradients with simple power controls. This reduces assembly times. The inductive heating elements can be made relatively small and can be sized with consideration of the target body size as to provide improved access (visual and physical) and focused heating zones relative to the assembly being heated.

As noted previously, one limitation of induction heaters, in general, is the requirement that the materials being heated have an appropriate combination of electrical conductivity and magnetic permeability. This limitation can be overcome for lower conductivity target bodies under the present invention by the use of a conductive "blanket" wrap for the target bodies (e.g., ceramic cylinders) in accordance with the present invention. One such wrap is a commercially available material carbon based fabric with longitudinal carbon fiber, glass/polyester cross-fibers, and fixed self-edging. Such a fabric is available from Suter Kunststoffe AG or "Suter Swiss" of Switzerland.

Under the present invention a variety of conductive textiles can be utilized with the material being suited for conducting electricity in an induction heater environment. For example, conductive textiles can be made with metal strands woven into the construction of the textile. Featured also are semiconducting textiles, made by impregnating normal textiles with carbon, or metal-based, powders. Embodiments of the present invention's conductive layer or wrap include conductive fabrics comprised of a non-conductive or less conductive substrate, which is then either coated or embedded with electrically conductive elements, often carbon, nickel, copper, gold, silver, or titanium, Although a number of wraps and sleeves, including metallic and non-metallic materials are featured, a wrap of a carbon-embedded woven fabric (i.e., composed of fiberglass or other ceramic fibers) provides efficient heating of the wrapped cylindrical target body such as one of ceramic $LiMO_2$ (e.g., $LiCoO_2$). Advantageously, with appropriate adjustment of the power and tuning of the frequency of the inductive heater controls, an annular inductive heating unit with dimensions allowing the wrapped hollow $LiCoO_2$ cylinder to be surrounded by the associated coils of the inductive heating unit provides efficient heating of this difficult to otherwise inductively heat material. Additionally, under the present invention, a backing tube of outer diameter (OD) smaller than the internal diameter (ID) of the cylinder target can be positioned within the hollow cylinder target, and the combination heated simultaneously.

For example, following placement of a target body (e.g., ceramic) cylinder with a pre-wetted inside diameter (ID) around a wetted outside diameter (OD) metallic backing tube, a conductive sleeve composed of such a material, or a wrap of this cloth can be taped to the outside surface of the ceramic cylinder or otherwise retained in place. This assembly is then positioned within the inductive coils of a heating ring. The inductive heating of the conductive wrap is easily controlled axially, with heat (radiatively) transferred radially to the cylinder (and internally to the backing tube). With an appropriate selection of power and frequency, balanced and simultaneous inductive heating of the backing tube and wrapped target body (e.g., ceramic) cylinder (and any wetting or thermal coefficient bridging added material) is achieved.

Inductive heating in accordance with the present invention is suited for a variety of cylindrical ceramic or metallic (e.g., low conductivity metals such as silicon) sputtering target materials having different dielectric constant values (either due to a variation within a common type of material as in a doping degree in (e.g., silicon and doped silicon such as boron doped silicon) or lower to higher Al content in AZO target bodies, etc.) or from one type of target body material to another type such as ITO, AZO, $LiMO_2$, etc.

As an example of a difficult to normally inductively heat target body, reference is made to AZO doped with less than 1% alumina and $LiMO_2$ (e.g., $LiCoO_2$) ceramic cylinders, the conductive wrap enables what otherwise would not be a deemed a successful heating for some types of sputtering target bonding. In other situations such as when dealing with poorly or semi conductive cylindrical metal target material (e.g., undoped silicon), a conductive wrap can be beneficial in that it can be used to more successfully achieve an induction based heating of the target body. In other words, whereas a boron doped silicon target body can be inductively heated in some situations directly without an added conductive wrap, an undoped silicon target body may require the addition of the conductive wrap to achieve successful bonding. Whether a wrap or not is needed (or helpful) can be determined by trial and error relative to the potential variety of target bodies and backing support materials featured under the present invention.

Further, in the bonding of target bodies such as $LiCoO_2$ ceramic cylinders, undesirable chemical reactions between the conductive wrap and the target body can result and generate an undesirable discoloration of the target surface under embodiments of the present invention; however, this is avoided with the protective layer or wrap of the present invention. For instance, a thin pre-wrap of the $LiCoO_2$ cylinder with a temperature-resistant polymer film (Kapton™ wrap) can protect the $LiCoO_2$ material from reaction, with excellent bonding quality obtained for the assembly.

In the bonding of B-doped silicon cylinders, the utilization of such a protective wrap on the target body's etched OD surface, enables the OD to remain clean of indium droplets and other debris facilitating fast final cleaning, but importantly, avoids any surface polishing which could give rise to dust formation which subsequently could deposit within segment gaps or remain on the surface and enter the sputtering chamber.

Under the present invention there can be reduced production costs by minimizing material loss due to cracking during bonding, associated rework to replace cracked tiles, and reduction in time required for final cleaning of the surface of a bonded assembly.

The induction heating system of the present invention preferably also includes a control unit associated with the induction heater which facilitates the control of radial and axial temperature gradients associated with the target body during heating. Typically an induction heater comprises a frequency power supply (or frequency generator), such as one that operates at either medium frequency (MF—30-300 kHz) or radio frequency (RF—MhZ) ranges and a work head (transformer), and a coil (inductor). Induction heating is generally a non-contact method of heating a conductive body by utilizing a strong magnetic field (e.g., the coil and coil casing of the induction heater surround the target body without contact during heating). Embodiments of the invention feature a generator having a capacity to operate up to 12 kHz with a maximum power output of 20 kW. This capacity is in excess of many of the typical uses of the invention which involve operating at lower power outputs of, for example, 2-3 kW. The power level can be set using controls of the induction heater and the frequency can be tuned to what is most desirable for the desired timing and level of heating of the relevant material of the target body assembly involved (e.g., backing tube material, wetting/gap bonding material and target body material).

Embodiments of the invention thus involve methods of manufacturing high quality sputtering target assemblies (and the sputtering target assemblies resulting from such manufacturing), inclusive of sputtering target assemblies that comprise target bodies of difficult materials such as $LiMO_2$ (e.g., $LiCoO_2$) (such as CIP $LiMO_2$ molded bodies) using induction heating (inclusive of conductive wrap usage when of assistance in the bonding of the sputtering targets), with the sputtering target assemblies comprising circumferentially arranged hollow target bodies (e.g., ceramic, and monolithic or stacked with and without spacers) to a backing tube. Embodiments of the present invention also include an advantageous arrangement wherein there is combined, in a target assembly formation process, a CIP based $LiMO_2$ (e.g., $LiCoO_2$) target body using the inductive heating technique described herein.

An example of the present invention includes the following bonding method:
 a) Bonding a cylindrically shaped sintered, target body (having an interior diameter (ID) and an outer diameter (OD) such as one refined by ID and/or OD machining) to a suitable backing support such as a tubular support with a bonding technique that comprises the following:
  i. wetting (e.g., direct wetting) of the target body ID of the cylinder (e.g., an $LiCoO_2$ cylinder) with a wetting material such as indium or an indium alloy;
  ii. wetting (e.g., direct wetting) of the OD of a tubular backing support (e.g., with a wetting material such as indium or an indium alloy);
  iii. positioning the tubular backing support circumferentially internally within the target body as to define a gap therebetween;
  iv. providing intermediate gap filling bonding material between the wetted surface such as additional indium or indium alloy to bind the target body or bodies to a corresponding backing support; and
  v. utilizing an induction heat generator in conjunction with the bonding process.

Embodiments of the invention include:
A) Forming a sputtering target assembly involving a method comprising:
 relative positioning of a sputtering target body and a backing support, with the sputtering target body having an inside diameter surface and each of the backing support and sputtering target body having an outside diameter surface, such that the backing support is placed within the inside diameter of the sputtering target body;
 heating with an induction heater the outside diameter of the sputtering target body such that bonding material (e.g., wetting material and/or bonding gap filler material) between the outside diameter of the backing support and inside diameter of the sputtering target body is heated (e.g., in conjunction with a heating of the backing tube as well for improved radial heat gradient formation across the entire induction heated/bonding area); and
 discontinuing heating with the induction heater such that there is a cooling of the bonding material and a bonding relationship establishment between the sputtering target body and backing support.
B) In the forming of the sputtering target assembly noted in A, positioning a conductive material (e.g., one that is independent of and radially inward spaced from the induction heater, or independent of, and in contact with the induction heater as with a non-conductive radially outer region in a conductive wrap or an insulating laminate layer) so as to extend along the outside diameter surface of the sputtering target body and in a position where the induction heater heats the conductive material.
C) In the forming of the sputtering target assembly noted in B, utilizing a (e.g., flexible) conductive wrap as the conductive material, which conductive wrap extends about the outside diameter surface of the sputtering target body.
D) In the forming of the sputtering target assembly noted in C, wherein the conductive wrap comprises carbon material.
E) In the forming of the sputtering target assembly noted in C, wherein the conductive wrap is a fabric that comprises carbon material and a flexible fabric component.
F) In the forming of the sputtering target assembly noted in B, the conductive material comprises carbon material.
G) In the forming of the sputtering target assembly noted in B, the sputtering target body is a cylindrical body formed of a material selected from the group consisting of low alumina AZO (e.g., less than 1% alumina by weight), doped or undoped $Li_3PO_4$, undoped silicon, ZnO and $LiMO_2$
H) In the forming of the sputtering target assembly noted in A, wherein the sputtering target body is of an $LiMO_2$ material (with embodiments featuring material M as part of a transitional metal oxide material, (e.g., where M includes the primary metals of interest such as Ni, Co, and Mn, or combinations thereof, and other dopants or modifiers including Ti, Al, V, Cr, Y, Sr, Ca, Zr, Zn, Si, Mg, Ga, W, Fe, Cu, La, or combinations thereof)). Also, embodiments of the present invention feature the $LiMO_2$ material in both stoichiometric and non-stoichiometric form (with the Li/M (e.g., Li/Co) ratio tuned to the sputtering apparatus, as in a Li/M ratio of 0.90 to 1.25, with 0.98 to 1.05 being illustrative).
I) In the forming of the sputtering target assembly noted in H, wherein the sputtering target body is of a $LiCoO_2$ material.
J) In the forming of the sputtering target assembly noted in A wherein relative positioning includes one or both of i) and ii)
 i) rotating the backing support during the heating and/or a cooling stage of the bonding material;
 ii) oscillation of the backing support during the heating and/or cooling stage.
K) In the forming of the sputtering target assembly noted in J, wherein the sputtering target body comprises $LiMO_2$.
L) In the forming of the sputtering target assembly noted in B, further providing, between the exterior surface of the sputtering target body and the conductive material, a protective film. The resultant sputtering target assembly in an embodiment of the present invention thus comprising, in an inward-to-outward radial sequence, a support tube, a binder, a sputtering target as described herein, a protective wrap, and a conductive wrap. About which is positioned an induction heater relative to a sputtering target assembly formation device.
M) In the forming of the sputtering target assembly noted in L, wherein the protective film is free of adhesive on a side opposing the outside diameter surface of the sputtering target body.
N) In the forming of the sputtering target assembly noted in A, at least one of the sputtering target body and backing support has a wetting material as bonding material being heated by the induction heater.
O) In the forming of the sputtering target assembly noted in N, each of the sputtering target body and backing support has a wetting material provided as bonding material being heated by the induction heater.
P) In the forming of the sputtering target assembly noted in N, that wetting material is a metal solder comprising Indium.
Q) In the forming of the sputtering target assembly noted in N, there is further provided, as bonding material to be heated, gap filling metal solder provided in a gap formed between the inside diameter of the sputtering target body and the outside diameter of the backing support.

R) In the forming of the sputtering target assembly noted in A, there is provided, as bonding material to be heated, conductive attachment material that is positioned so as to fill the gap formed between the inside diameter of the sputtering target body and the outside diameter of the backing support.

S) In the forming of the sputtering target assembly noted in A, the sputtering target body is a ceramic hollow cylindrical body.

T) In the forming of the sputtering target assembly noted in A, the sputtering target body is of a material selected from a group consisting of gallium aluminum zinc oxide (GAZO), gallium indium tin oxide (GITO), indium gallium zinc oxide (IGZO), indium zinc oxide (IZO), doped-$SnO_2$, antimony tin oxide (ATO), $LiMO_2$, $Li_3PO_4$, doped-$Li_3PO_4$, ITO, AZO, silicon, and B-doped silicon.

U) In the forming of the sputtering target assembly noted in T, wherein the sputtering target body is of $LiMO_2$.

V) In the forming of the sputtering target assembly noted in U, wherein the sputtering target body is of $LiCoO_2$.

W) In the forming of the sputtering target assembly noted in A, further comprising positioning a conductive material layer so as to extend along the outside diameter surface of the sputtering target body and in a position where the induction heater heats the conductive material layer, and wherein the backing support is in the form of a hollow, cylindrical tube comprising a metal.

X) In the forming of the sputtering target assembly noted in W, wherein the backing support comprises titanium.

Y) In the forming of the sputtering target assembly noted in A, further comprising providing a protective wrap on the target body.

Z) In the forming of the sputtering target assembly noted in Y, the protective wrap is fixed on the target body outside diameter surface with a tape material.

AA) In the forming of the sputtering target assembly noted in B, the conductive material is fixed in position with tape.

BB) In the forming of the sputtering target assembly noted in A, the method of assembly further comprises the step of positioning a conductive wrap so as to extend along the outside diameter surface of the sputtering target body and in a position where the induction heater heats the conductive wrap, the conductive wrap being positioned so as to extend around the outer diameter of the sputtering target body.

CC) In the forming of the sputtering target assembly noted in BB, the conductive wrap is spirally wound around the outer diameter of the sputtering target body with an overlap (e.g., with different overlap degrees to alter the axial heat gradient along the sputtering target body during a bonding operation).

DD) In the forming of the sputtering target assembly noted in BB, the conductive wrap is one of plurality of conductive wraps wrapped about the sputtering target body (or there is a repeated wrapping arrangement as to provide multiple wrap laminate layers (such as one underlying wrap section or layer fully covering over an entire axial length of the target and an additional wrapped layer of the conductive wrap covering over the underlying layer of the conductive wrap)).

EE) In the forming of the sputtering target assembly noted in BB wherein at least one of the induction heater and sputtering target body is mutually adjusted relative to the other.

FF) In the forming of the sputtering target assembly noted in EE wherein the sputtering target body is adjusted relative to a fixed in position induction heater.

GG) In the forming of the sputtering target assembly noted in A, there is provided a plurality of sputtering target bodies in a series arrangement along the backing support, with each sputtering target body being subjected to induction heating during the bonding purposes.

HH) In the forming of the sputtering target assembly noted in GG wherein there is one or more induction heaters extending about the backing support and circumferentially extending about one or more of the sputtering target bodies so as to inductively heat an adjacent sputtering target body or bodies.

II) In the forming of the sputtering target assembly noted in HH wherein there are a plurality of induction heaters arranged in series along the backing support.

JJ) In the forming of the sputtering target assembly noted in GG wherein there are a plurality of sputtering target bodies with one or more having a conductive wrap extending thereabout, and wherein the induction heater is positioned to inductively heat the one or more conductive wraps.

KK) In the forming of the sputtering target assembly noted in JJ wherein each of the plurality of the sputtering target bodies has a conductive wrap.

LL) In the forming of the sputtering target assembly noted in JJ wherein there are differences in an amount of conductive wrap conductive material provided on at least two different sputtering target bodies arranged along the backing support (e.g., differences in conductive material from wrap to wrap, differences in the number or length of a wrap from one to another, differences in the relative amount of overlap percentage as in a helically spiraled wrap with varying percentage of overlap, etc.).

MM) Forming a sputtering target assembly involving a method comprising:
    positioning a backing tube, a sputtering target body and an induction heater so as to be in a circumferential arrangement with the backing tube being internal, the sputtering target body being intermediate, and the induction heater being external;
    operating the induction heater so as to heat the sputtering target body; and
    providing a bonding material to a gap formed between the backing tube and the sputtering target body which is subject to induction heating.

NN) Forming a sputtering target assembly as recited in claim MM further comprising providing a conductive wrapping circumferentially between the sputtering target body and the induction heater.

OO) Forming a sputtering target assembly as recited in claim NN wherein the conductive wrapping is a flexible conductive fabric that is wrapped and fixed in position on the sputtering target body.

PP) Forming a sputtering target assembly as recited in claim NN wherein the conductive wrapping is a carbon material conductive wrapping.

QQ) Forming a sputtering target assembly as recited in claim NN wherein there is positioned a protective wrapping between the sputtering target body and the conductive wrapping.

RR) Forming a sputtering target assembly as recited in claim MM wherein the sputtering target body is a hollow cylindrical body of a material selected from a group consisting of gallium aluminum zinc oxide (GAZO), gallium indium tin oxide (GITO), indium gallium zinc oxide (IGZO), indium zinc oxide (IZO), doped-$SnO_2$, antimony tin oxide (ATO), $LiMO_2$, $Li_3PO_4$, doped-$Li_3PO_4$, ITO, AZO, silicon, and B-doped silicon.

SS) In the forming of the sputtering target assembly as recited in claim MM wherein the backing support is a backing tube formed of a material of molybdenum, stainless steel, titanium, aluminum or aluminum alloys, and copper or copper alloys.

TT) In the forming of the sputtering target assembly noted in MM, there is provided a plurality of sputtering target bodies in a series arrangement along the backing support, with each sputtering target body being subjected to induction heating during the bonding process for bonding purposes.

UU) In the forming of the sputtering target assembly noted in TT, further comprising providing a conductive wrapping circumferentially between the sputtering target body and the induction heater for one or more of the sputtering target bodies.

VV) In the forming of the sputtering target assembly noted in UU wherein there is provided a conductive wrapping provided on multiple target bodies and wherein different amounts of conductive material in the conductive wrappings is present between at least two of the sputtering target as to provide different axial heat gradient formation during induction heating.

WW) In the forming of the sputtering target assembly noted in TT wherein at least one of the plurality of sputtering targets is axially adjusted in position relative to the induction heater.

XX) An assembly comprising,
 a backing support with an outer surface (or outer diameter surface);
 a sputtering target body with an outer surface (or outer diameter surface) and an interior surface, with the backing support extending axially through the interior surface; and
 an induction heater in heat communication relationship with the sputtering target body.

YY) The assembly of XX, wherein the induction heater extends circumferentially about the target body and is positioned as to have a common horizontal plane cross section with the target body.

ZZ) The assembly of claim XX, further comprising a conductive layer extending about the target body and positioned for induction heating by the induction heater.

AAA) The assembly of claim ZZ, further comprising a protective wrap extending about the target body and internal of the conductive layer.

BBB) The assembly of claim ZZ, wherein the conductive layer is a conductive wrap this is arranged on the target body in spiral fashion.

CCC) The assembly of claim XX, further comprising a bonding material positioned between the backing support and target body and positioned for heat communication with the induction heater.

DDD) The assembly of XX, wherein there are a plurality of target bodies and one or more induction heaters configured for heat communication with the target bodies.

EEE) The assembly of claim DDD, wherein each of the target bodies has a conductive layer in the form of a conductive material wrapping.

In the above described illustrative inventive embodiments, the reference back from one lettered example to an earlier lettered example can be varied and expanded upon. For example, the reference of example "H" to "A" can be expanded upon to be each of "A" to "G" rather than just "A", with each other possible consistent combination being a feature of the present invention relative to the examples "A" to "EEE" provided above.

EMBODIMENTS OF THE INVENTION

Viewed from a first aspect, the invention can further provide the following first process (or method) embodiments:

Embodiment 1

A first process of forming a rotary sputtering target comprising the steps of:
 providing a heat-conductive (and preferably electrically conductive) material-based backing tube having an outer diameter and an outer diameter surface that is defined around a (central) longitudinal axis of the backing tube;
 providing a first hollow cylindrical target body having a (central) longitudinal axis defined between two edges of the first body, said edges (bottom and top edges) being opposed to each other, an inner diameter, an inner diameter surface, an outer diameter, and an outer diameter surface, said inner diameter surface and outer diameter surface being defined around the longitudinal axis of the first hollow cylindrical target body, said first hollow cylindrical target body consisting of—or comprising an electrically conductive material and thereby being an electrically conductor body;
 providing (at least) one induction heater having an inner diameter;
 at least partially, preferably fully, coating said inner diameter surface of the first hollow cylindrical target body with a soldering material such as an indium-based material so to form a wetted inner diameter surface of the first hollow cylindrical target body;
 at least partially, preferably fully, coating said outer diameter surface of the backing tube with a soldering material such as an indium-based material so to form a wetted outer diameter surface of the backing tube;
 positioning the backing tube vertically and coaxially within the inner diameter of the first hollow cylindrical target body, so as to have the longitudinal axis of the first cylindrical target body being (substantially) parallel to the longitudinal axis of the backing tube, and forming thereby a first assembly made of a first portion of the backing tube with its outer diameter surface being wetted (by said soldering material) and the first hollow cylindrical target body having its inner diameter surface being wetted (by said soldering material), said first assembly having a (central) longitudinal axis and presenting a first gap formed between the wetted outer diameter surface of the first portion of the backing tube and the wetted inner diameter surface of the first hollow cylindrical target body, said first gap being defined around said longitudinal axis of the first assembly, said first assembly having a top open end access and a bottom (optionally open) end access to said first intermediate gap, respectively positioned at a first and second extremities of the first assembly, said first and second extremities of the first assembly being opposed to each other. Optionally, the backing tube is positioned in such a way that its longitudinal axis is deviating from a reference axis perpendicular to a horizontal plane by an angle comprised between 0° and +/−5°, preferably between 0° C. and +/−2°;
 positioning the first assembly internally within the inner diameter of the (at least) one induction heater;
 pre-heating with the (at least) one induction heater the first hollow cylindrical target body, or the first hollow cylindrical target body and at least the first portion of the backing tube, of the first assembly at a first temperature that is kept sufficient to maintain under a molten-phase a soldering material to be poured through the top open end access, in said first gap so as to fill said first gap, said first temperature being preferably superior or equal to 180° C., more preferably superior or equal to 190° C., most preferably between 180° C. and 190° C., optionally between 180° C. and 200° C. In such that way, said first gap is brought up to a high enough temperature so as to allow the molten solder to flow from the top end access to the bottom end access;

filling, through the top open end access of the first assembly, the first gap with a soldering material under its molten-phase, such as a molten indium-based material, between the wetted inner diameter surface of the first hollow cylindrical target body and the wetted outer diameter surface of the first portion of the backing tube; and heating with the (at least) one induction heater said first hollow cylindrical target body, or said first hollow cylindrical target body and the first portion of the backing tube, of the first assembly along the longitudinal axis of the first assembly, such that a first axial temperature gradient is created from the bottom open end to the top open end of the first assembly (or of the body), said first axial temperature gradient being a positive gradient, said axial gradient being oriented longitudinally and displaced along a direction (substantially) parallel to the longitudinal axis of the first assembly, thereby inducing a cooling of the soldering material in the first gap, from the bottom to the top open end accesses, and thereby creating a bond, from the bottom to the top open end accesses, between the inner diameter surface of the first hollow cylindrical target body and the outer diameter surface of the first portion of the backing tube, so as to form said rotary sputtering target.

The first axial temperature gradient is positive, which means that the temperature value of the first assembly or of the first body increases from the bottom open access (or bottom level) to the top open end access (or top level) of the first assembly comprising the first body and the first portion of the backing tube.

The first positive axial gradient is longitudinally oriented, which means that the temperature value increases from the bottom open access to the top open end access in a direction parallel to the longitudinal axis of the first assembly.

Optionally, the first axial temperature gradient is designed such that, for instance, the temperature measured at the bottom level of the first assembly is comprised between 25° C. and 150° C., preferably between 25° C. and 100° C., more preferably between 25° C. and 75° C., most preferably between 25° C. and 50° C. Optionally, the temperature at the bottom level of the first assembly is, for instance, measured in a first defined area of the outer diameter surface of the target body. In another alternative, the temperature at the bottom level of the first assembly is measured at a bottom edge of the first body.

The temperature measured at the top level of the first assembly is comprised between 180° C. and 250° C., preferably between 190° C. and 200° C. Similarly, the temperature at the top level of the first assembly is optionally measured in a second defined area of the outer diameter surface of the target body. In another alternative, the temperature at the top level of the first assembly is measured at a top edge of the first body.

By modulating appropriately the operating frequency and power of the one (or more) induction heater during the heating step, the temperature profile between the bottom and top open end accesses can be adjusted in such a way that a first axial temperature gradient, oriented longitudinally, is created from the bottom open end to the top open end of the first assembly and by further operating appropriately the one (or more) induction heater, said first axial temperature gradient is (progressively) shifted or displaced from the bottom to the top open access ends, inducing thereby the (progressive) cooling of the components: target body+backing tube's first portion.

The displacement or shift of the first axial positive temperature gradient can be ensured, for instance, by using an induction heater at an appropriate power and frequency and by displacing said induction heater along the longitudinal axis of the first assembly, in a direction defined from the bottom end to the top end and with an appropriate speed, so as to induce thereby the (progressive) cooling of the components: target body+backing tube's first portion.

Alternatively, a series of several induction heaters can be used so as to form an edifice of at least two induction heaters in such a way that said edifice fully encompasses the first assembly in the induction heater edifice's inner diameter, and the shift or displacement of the first axial temperature gradient is obtained by modulating each of the induction heaters independently, so as to induce thereby the (progressive) cooling of the components: target body+backing tube's first portion.

In this specific embodiment, the shift/displacement of the first axial gradient is ensured by modulating each heater of the edifice in such a way that said first axial gradient is moved forward from a first heater (a bottom heater in a vertical edifice) to an umpteenth heater (or top heater in said vertical edifice) across the edifice of several heaters.

To the first axial temperature gradient can be associated a first radial temperature gradient. This first radial temperature gradient is a negative gradient oriented from the outer diameter surface of the cylindrical hollow target body to the (preferably centered) longitudinal axis of the backing tube or of the first assembly (i.e. to the inner diameter surface of the backing tube).

A negative gradient means in the framework of the present invention that the temperature decreases from the first body outer diameter surface to the backing tube outer surface.

The combination of the first axial and radial gradients results in the creation of a first longitudinal gradient section crossing the first assembly along the longitudinal axis of said first assembly, said first longitudinal gradient section having its length being superior or equal to a predetermined length of the one (or more) induction heater; a width of said first longitudinal gradient section corresponding to a predetermined (penetration) depth length of the first radial gradient in the first assembly.

When said first radial gradient co-exists with said first axial gradient, during the heating step, it is the first longitudinal gradient section that is shifted/displaced from the bottom end to the top end accesses of the first assembly, so as to induce a cooling of the soldering material in the first gap, from the bottom to the top open end accesses, and from the outer diameter surface of the first portion of the backing tube to the inner diameter surface of the first hollow cylindrical target body, thereby creating a bond, from the bottom to the top open end accesses, between the inner diameter surface of the first hollow cylindrical target body and the outer diameter surface of the first portion of the backing tube, so as to form said rotary sputtering target.

Embodiment 2

The first process of forming a rotary sputtering target comprising an additional step of:

at least partially, preferably fully, covering the outer diameter surface of the first hollow cylindrical target body with a first protective material removably (i.e. on the basis of a non-permanent way) connected to said outer diameter surface of the first hollow cylindrical target body, said step of at least partially covering of the outer diameter surface of the first hollow cylindrical target being performed before the step of filling the first gap with a soldering material, preferably, the step of at least partially covering of the outer diameter surface of the first hollow cylindrical target body by said first protective material is performed before the step of coating the inner diameter surface of the first hollow cylindrical target body with a soldering material.

Optionally, in embodiment 2, the first protective material is a protective film or a protective wrap.

In embodiment 2, the first protective material can be connected and retained to the outer diameter surface of the first hollow cylindrical target body by a retention means.

Preferably, in embodiment 2, the first protective material is a removable and non-adhesive film or wrap.

More preferably, in embodiment 2, the first protective material is a polyimide-based film or polyimide-based wrap.

In particular, the first protective material is preferably self-adhering.

The first protective material is preferably removed after the step of filling the first gap with the solder material.

Alternatively, the first protective material can be removed after the step of heating.

Preferentially, the protective material is removed at the very end of a multi-bonding steps wherein several (at least two) hollow cylindrical targets are bounded on the backing tube.

Embodiment 3

The first process of forming a rotary sputtering target, wherein the backing tube is rotated and/or oscillated along its longitudinal axis during the pre-heating step and/or the heating step.

Embodiment 4

The first process of forming a rotary sputtering target comprising, prior to the step of filling the first gap with a molted soldering material, a step of covering the bottom open end access of the first assembly with a covering means such as a seal, preferably a rubber seal, so as to prevent the molten soldering material to flow through the bottom open end access during the step of filling the first gap with the soldering material.

Embodiment 5

The first process of forming a rotary sputtering target comprising, after the step of heating, a step of removing said covering means from the bottom open end of the first assembly.

Embodiment 6

The first process of forming a rotary sputtering target comprising the steps of:

providing at least a second electrically conductive hollow cylindrical target body having an inner diameter, an outer diameter, and a (central) longitudinal axis around which an inner diameter surface and an outer diameter surface are defined, said second hollow cylindrical target body consisting of—or comprising an electrical conductive material;

at least partially, preferably fully, coating said inner diameter surface of the second hollow cylindrical target body with a soldering material such as an indium-based material so to form a wetted inner diameter surface of the second hollow cylindrical target body;

keeping positioning or positioning the backing tube, on which the first hollow cylindrical target is bonded, vertically and coaxially within the inner diameter of the second hollow cylindrical target body so as to have the longitudinal axis of the second cylindrical target body being (substantially) parallel to the longitudinal axis of the backing tube, and forming thereby a second assembly made of the second hollow cylindrical target body having said its inner diameter surface being wetted (by said soldering material) and a second portion of the backing tube having a wetted outer diameter surface being at least partially, preferably fully, coated with a soldering material, said second portion being separated from the first portion by a predetermined separation distance, said second assembly having a (central) longitudinal axis and a second gap formed between the wetted outer diameter surface of the second portion of the backing tube and the wetted inner diameter surface of the second hollow cylindrical target body, said second gap being defined around said longitudinal central axis of the second assembly, said second assembly having a top and bottom open end accesses to said second gap, respectively positioned at a first and second extremities of the second assembly, said first and second extremities of the second assembly being opposed to each other.

Optionally, the backing tube is positioned in such a way that its longitudinal axis is deviating from a reference axis perpendicular to a horizontal plane by an angle comprised between 0° and +/−5°, preferably between 0° C. and +/−2°;

positioning the second assembly internally within the inner diameter of the one (or more) induction heater;

pre-heating with the one (or more) induction heater the second hollow cylindrical target body, or the second hollow cylindrical target body and the second portion of the backing tube, of the second assembly at a second temperature that is kept sufficient to maintain under a molten-phase a soldering material to be poured, through the top open end access, in said second gap so as to fill said second gap, said second temperature being preferably superior or equal to 180° C. and optionally inferior to 250° C., more preferably superior or equal to 190° C. and optionally inferior to 200° C.;

filling, through the top open end access of the second assembly, the second gap with a soldering material under its molten-phase, such as a molten indium-based material, between the wetted inner diameter surface of the second hollow cylindrical target body and the wetted outer diameter surface of the second portion of the backing tube; and heating with the one (or more) induction heater said second hollow cylindrical target body, or said second hollow cylindrical target body and the second portion of the backing tube, along the longitudinal axis of the second assembly, such that a second axial temperature gradient is created from the bottom open end to the top open end of the second assembly, said second axial temperature gradient being a positive gradient that is longitudinally oriented and displaced along a direction defined from the bottom end access to the top end access of the second assembly, thereby inducing a cooling of the soldering material in the second gap, from the bottom to the top open end accesses, and creating a bond, from the bottom to the top open end accesses, between the inner diameter surface of the second hollow cylindrical target body and the outer diameter surface of the second portion of the backing tube, so as to form a rotary sputtering target having at least two cylindrical hollo target bodies bonded on the backing tube. The second axial temperature gradient is positive, which means that the temperature value increases from the bottom open access (bottom level) to the top open end access (top level).

The second positive axial gradient is longitudinally oriented, which means that the temperature value increases from the bottom open access to the top open end access in a direction parallel to the longitudinal axis of the second assembly.

Optionally, the second axial temperature gradient is designed such that, for instance, the temperature measured at the bottom level of the second assembly (or at a bottom edge of the second body) is comprised between 25° C. and 150° C., preferably between 25° C. and 100° C., more preferably between 25° C. and 75° C., most preferably between 25° C. and 50° C. Alternatively, the temperature at the bottom level of the second assembly is, for instance, measured in a first defined area of the outer diameter surface of the target body or at the bottom edge of the second body.

The temperature measured at the top level of the second assembly is comprised between 180° C. and 250° C., preferably between 190° C. and 200° C. Similarly, the temperature at the top level of the second assembly (or at a top edge of the second body) is optionally measured in a second defined area of the outer diameter surface of the target body or at the top edge of the second body.

In this embodiment, the mechanism of bonding the second target body with the second portion of the backing tube is, by analogy, similar to the one explained in the embodiment 1 relative to the first process according to the present invention, and is further explained below.

By modulating appropriately the operating frequency and power of the one (or more) induction heater during the heating step, the temperature profile between the bottom and top open end accesses can be adjusted in such a way that second axial temperature gradient, oriented longitudinally, is created from the bottom open end to the top open end of the second assembly and by further operating appropriately the one (or more) induction heater, said second axial temperature gradient is (progressively) shifted or displaced from the bottom to the top open access ends, inducing thereby the (progressive) cooling of the components: target body+backing tube's second portion.

The displacement or shift of the second axial positive temperature gradient can be ensured, for instance, by using one induction heater at an appropriate power and frequency and by displacing said induction heater along the longitudinal axis of the second assembly, in a direction defined from the bottom end to the top end and with an appropriate speed, so as to induce thereby the (progressive) cooling of the components: second target body+backing tube's second portion.

Alternatively, a series of several induction heaters can be used so as to form an edifice of at least two induction heaters, so as to fully encompass the second assembly in the induction heater edifice's inner diameter, and the shift or displacement of the second axial temperature gradient is obtained by modulating each of the induction heaters independently, so as to induce thereby the (progressive) cooling of the components: second target body+backing tube's second portion.

To the second axial temperature gradient can be associated a second radial temperature gradient. This second radial temperature gradient is a negative gradient oriented from the outer diameter surface of the cylindrical hollow target body to the preferably centered longitudinal axis of the backing tube (to the inner diameter of the backing tube).

The combination of the second axial and radial gradients results in the creation of a second longitudinal gradient section crossing the second assembly along the longitudinal axis of said second assembly, said second longitudinal gradient section having its length being superior or equal to a predetermined length of the one (or more) induction heater; a width of said second longitudinal gradient section corresponding to a predetermined penetration depth length of the second radial gradient.

When said second radial gradient co-exists with said second axial gradient, during the heating step, it is the second longitudinal gradient section that is shifted/displaced from the bottom end to the top end of the second assembly, so as to induce a cooling of the soldering material in the second gap, from the bottom to the top open end accesses, and from the outer diameter surface of the second portion of the backing tube to the inner diameter surface of the second hollow cylindrical target body, thereby creating a bond, from the bottom to the top open end accesses, between the inner diameter surface of the second hollow cylindrical target body and the outer diameter surface of the second portion of the backing tube, so as to form said rotary sputtering target.

Embodiment 7

The first process of forming a rotary sputtering target comprising an additional step of:
at least partially, preferably fully, covering the outer diameter surface of the second hollow cylindrical target body with a second protective material such a protective film or wrap, preferably with a removable and non-adhesive film or wrap, more preferably with a polyimide-based film or polyimide-based wrap, said second protective material, being preferably self-adhering, is removably connected to said outer diameter surface of the second hollow cylindrical target, preferably by a retention means, said step of at least partially covering of the outer diameter surface of the second hollow cylindrical target being performed before the step of filling the second gap with a soldering material, preferably, the step of at least partially covering of the outer diameter surface of the second hollow cylindrical target body is performed before the step of coating the inner diameter surface of the second hollow cylindrical target body with a soldering material.

Embodiment 8

The first process of forming a rotary sputtering target according to the embodiment 6 or 7, wherein the backing tube is rotated and/or oscillated along its longitudinal axis during the pre-heating step and/or the heating step.

Embodiment 9

The first process of forming a rotary sputtering target comprising, prior to the step of filling the second gap with a soldering material, a step of covering the bottom open end access of the second assembly with a covering means such as a seal, preferably a rubber seal.

Embodiment 10

The first process of forming a rotary sputtering target according to the embodiment 9, comprising, after the step of heating, a step of removing said covering means from the bottom open end of the second assembly.

Embodiment 11

The first process of forming a rotary target according, wherein any of the steps of the embodiments 6 to 10 are repeated so as to form a rotary sputtering target presenting at least three target bodies bonded on said backing tube, preferably three to five target bodies bonded on said backing tube.

Embodiment 12

The first process of forming a rotary target comprising a step of selecting a first and/or a second cylindrical hollow target body that comprises a conductive material chosen from the group consisting of: gallium aluminum zinc oxide (GAZO), gallium indium tin oxide (GITO), indium gallium zinc oxide (IGZO), indium zinc oxide (IZO), doped-SnO2, antimony tin oxide (ATO), ITO, AZO, silicon, and B-doped silicon.

Embodiment 13

The first process of forming a rotary target comprising a step of selecting a backing tube that comprises, preferably that is constituted of, an electrically conductive material chosen from the group consisting of: molybdenum, stainless steel, titanium, aluminum, and copper, or any alloys of said materials.

Embodiment 14

The first process of forming a rotary comprising a step of selecting a backing tube that is constituted of titanium or any alloys of titanium.

Embodiment 15

The first process for forming a rotary target, comprising:
a step of providing a first (and preferably at least a second) wetted hollow cylindrical target bodies having an inner diameter, an inner diameter surface, an outer diameter, and an outer diameter surface, said first and second hollow cylindrical target bodies comprising—or consisting of an electrical conductive material and thereby being electrical conductor bodies, said wetted hollow cylindrical target bodies having their inner diameter surface at least partially, preferably fully, coated with a soldering material such as an indium-based material; and a step of providing a heat-conductive (and preferably electrically conductive) material-based wetted backing tube presenting an outer diameter and an at least partially, preferably fully, coated outer diameter surface with a soldering material such as an indium-based material, wherein the step of forming a wetted inner diameter surface of the first (and preferably second) cylindrical hollow target bodies and the step of forming a wetted outer diameter surface of the backing tube are skipped.

Viewed from a second aspect, the invention can further provide the following second process (or method) embodiments:

Embodiment 16

The second process of forming a rotary sputtering target comprising the steps of:
providing a heat-conductive (and preferably electrically conductive) material-based backing tube presenting an outer diameter and an outer diameter surface that is defined around a (central) longitudinal axis of the backing tube;
providing a first hollow cylindrical target body having an inner diameter; an outer diameter; and a (central) longitudinal axis around which an inner diameter surface and an outer diameter surface are defined, said first hollow cylindrical target body comprising a low electrically conductive material and thereby being a low electrically conductor body;
providing one (or more) induction heater having an inner diameter and an inner diameter surface;
at least partially, preferably fully, coating said inner diameter surface of the first hollow cylindrical target body with a soldering material such as an indium-based material so to form a wetted inner diameter surface of the first cylindrical hollow target body;
at least partially, preferably fully, coating said outer diameter surface of the backing tube with a soldering material such as an indium-based material so to form a wetted outer diameter surface of the backing tube;
positioning the backing tube vertically and coaxially within the inner diameter of the first hollow cylindrical target body, so as to have the longitudinal axis of the first cylindrical target body being (substantially) parallel to the longitudinal axis of the backing tube, and forming thereby a first assembly made of a first portion the backing tube with its outer diameter surface being wetted (by said soldering material) and the first hollow cylindrical target body having its inner diameter surface being wetted (by said soldering material), said first assembly having a (central) longitudinal axis and presenting a first gap formed between the wetted outer diameter surface of the first portion of the backing tube and the wetted inner diameter surface of the first hollow cylindrical target body, said first gap being defined around said longitudinal axis, said first assembly having a top open end access and a bottom open end access to said first intermediate gap, respectively positioned at a first and second extremities of the first assembly, said first and second extremities of the first assembly being opposed to each other. Optionally, the backing tube is positioned in such a way that its longitudinal axis is deviating from a reference axis perpendicular to a horizontal plane by an angle comprised between 0° and +/−5°, preferably between 0° C. and +/−2°;

at least partially, preferably fully, covering the outer diameter surface of the first hollow cylindrical target body with a first electrically conductive material such as an electrically conductive film or an electrically conductive wrap, preferably with a removable and non-adhesive conductive film or wrap, more preferably with a carbon-based electrically conductive film or carbon-based electrically conductive wrap, said first electrically conductive material being removably connected to said outer diameter surface of the first hollow cylindrical target body by a retention means or said first electrically conductive material being self-adhering to said outer diameter surface of the first hollow cylindrical target body;

positioning the first assembly internally within the inner diameter of the induction heater, such that said first electrically conductive material is placed between said outer diameter surface of the first hollow cylindrical target body and said inner diameter surface of said induction heater;

pre-heating with the (or more) induction heater, through the presence of the first electrically conductive material, the first hollow cylindrical target body, or the first hollow cylindrical target body and the first portion of the backing tube, at a first temperature that is kept sufficient to maintain under a molten-phase a soldering material to be poured in said first gap so as to fill said first gap, said first temperature being preferably superior or equal to 180° C., more preferably superior or equal to 190° C.;

filling, through the top open end access of the first assembly, the first gap with a soldering material under its molten-phase, such as a molten indium-based material, between the wetted inner diameter surface of the first hollow cylindrical target body and the wetted outer diameter surface of the first portion of the backing tube; and heating with the (or more) induction heater, through the presence of the first electrically conductive material, said first hollow cylindrical target body, or said first hollow cylindrical target body and the first portion of the backing tube, along the longitudinal axis of the first assembly, such that a first axial temperature gradient is created from the bottom open end to the top open end of the first assembly, said first axial temperature gradient being a positive gradient longitudinally oriented and displaced/shifted in a direction defined between the bottom and the top end accesses of the first assembly, thereby inducing a cooling of the soldering material in the first gap, from the bottom to the top open end accesses, and creating a bond, from the bottom to the top open end accesses, between the inner diameter surface of the first hollow cylindrical target body and the outer diameter surface of the first portion of the backing tube, so as to form said rotary sputtering target.

In this embodiment, the mechanism of bonding the first target body with the first portion of the backing tube is by analogy similar to the one explained in the embodiment 1 relative to the first process according to the present invention, and detailed below.

The first axial temperature gradient is positive, which means that the temperature value increases from the bottom open access (bottom level) to the top open end access (top level) of the first assembly.

The first positive axial gradient is longitudinally oriented, which means that the temperature value increases from the bottom open access to the top open end access in a direction parallel to the longitudinal axis of the first assembly.

Optionally, the first axial temperature gradient is designed such that, for instance, the temperature measured at the bottom level of the first assembly is comprised between 25° C. and 150° C., preferably between 25° C. and 100° C., more preferably between 25° C. and 75° C., most preferably between 25° C. and 50° C. Optionally, the temperature at the bottom level of the first assembly is, for instance, measured in a first defined area of the outer diameter surface of the target body, or on a bottom edge of the target body.

The temperature measured at the top level of the first assembly is comprised between 180° C. and 250° C., preferably between 190° C. and 200° C. Similarly, the temperature at the top level of the first assembly is optionally measured in a second defined area of the outer diameter surface of the target body, or on a top edge of the target body.

By modulating appropriately the operating frequency and power of the one (or more) induction heater during the heating step, the temperature profile between the bottom and top open end accesses can be adjusted in such a way that first axial temperature gradient, oriented longitudinally, is created from the bottom open end to the top open end of the first assembly and by further operating appropriately the one (or more) induction heater, said first axial temperature gradient is (progressively) shifted or displaced from the bottom to the top open access ends, inducing thereby the (progressive) cooling of the components: target body+backing tube's first portion.

The displacement or shift of the first axial positive temperature gradient can be ensured, for instance, by using one induction heater at an appropriate power and frequency and by displacing said induction heater along the longitudinal axis of the first assembly, in a direction defined from the bottom end to the top end and with an appropriate speed, so as to induce thereby the (progressive) cooling of the components: target body+backing tube's first portion.

Alternatively, a series of several induction heaters can be used so as to form an edifice of at least two induction heaters, so as to fully encompass the first assembly in the induction heater edifice's inner diameter, and the shift or displacement of the first axial temperature gradient is obtained by modulating each of the induction heaters independently, so as to induce thereby the (progressive) cooling of the components: target body+backing tube's first portion.

To the first axial temperature gradient can be associated a first radial temperature gradient. This first radial temperature gradient is a negative gradient oriented from the outer diameter surface of the cylindrical hollow target body to the preferably centered longitudinal axis of the backing tube (to the inner diameter of the backing tube).

The combination of the first axial and radial gradients results in the creation of a first longitudinal gradient section crossing the first assembly along the longitudinal axis of said first assembly, said first longitudinal gradient section having its length being superior or equal to a predetermined length of the one (or more) induction heater; a width of said first longitudinal gradient section corresponding to a predetermined penetration depth length of the first radial gradient.

When said first radial gradient co-exists with said first axial gradient, during the heating step, it is the first longitudinal gradient section that is shifted/displaced from the bottom end to the top end of the first assembly, so as to induce a cooling of the soldering material in the first gap, from the bottom to the top open end accesses, and from the outer diameter surface of the first portion of the backing tube to the inner diameter surface of the first hollow cylindrical target body, thereby creating a bond, from the bottom to the top open end accesses, between the inner diameter surface of the first hollow cylindrical target body and the outer diameter surface of the first portion of the backing tube, so as to form said rotary sputtering target.

In the framework of this embodiment, the axial and radial first gradients are defined by the application of an appropriate frequency/power of the one (or more) induction heater and the presence of the first electrically conductive material that converts the radiation emitted by the one (or more) induction heater into heat.

Embodiment 17

The second process method of forming a rotary sputtering target comprising, prior the step of covering the outer diameter surface of the first hollow cylindrical target body with a first electrically conductive material, an additional step of:
- at least partially, preferably fully, covering the outer diameter surface of the first hollow cylindrical target body with a first protective material such as a protective film or a protective wrap, preferably with a removable and non-adhesive film or wrap, more preferably with a polyimide-based film or polyimide-based wrap, said first protective material being removably connected to said outer diameter surface of the first hollow cylindrical target body by a retention means or said first protective material being self-adhering to the outer diameter surface of the first hollow cylindrical target body, said step of at least partially covering of the outer diameter surface of the first hollow cylindrical target being performed before the step of filling the first gap with a soldering material, preferably, the step of at least partially covering of the outer diameter surface of the first hollow cylindrical target body is performed before the step of coating the inner diameter surface of the first hollow cylindrical target body with a soldering material.

Embodiment 18

The second process of forming a rotary sputtering target according to the embodiment 16 or 17, wherein the backing tube is rotated and/or oscillated along its longitudinal axis during the pre-heating step and/or the heating step.

Embodiment 19

The second process of forming a rotary sputtering target according to any of the embodiments 16 to 18, comprising, prior to the step of filling the first gap with a molted soldering material, a step of covering the bottom open end access of the first assembly with a covering means such as a seal, preferably a rubber seal.

Embodiment 20

The second process of forming a rotary sputtering target according to the embodiment 19, comprising, after the step of heating, a step of removing said covering means from the bottom open end of the first assembly.

Embodiment 21

The second process of forming a rotary sputtering target according to any of the embodiments 16 to 20, comprising, after the step of heating, a step of removing said first conductive material, preferably followed by a step of removing said first protective material.

Embodiment 22

The second process of forming a rotary sputtering target according to any of the embodiments 16 to 21, comprising the steps of:
- providing at least a second hollow cylindrical target body having a (central) longitudinal axis, an inner diameter, an inner diameter surface, an outer diameter, and an outer diameter surface, the inner diameter surface and the outer diameter surface are defined around said longitudinal axis of the second hollow cylindrical target body, said second hollow cylindrical target body consisting of—or comprising a low-electrically conductive material;
- at least partially, preferably fully, coating said inner diameter surface of the second hollow cylindrical target body with a soldering material such as an indium-based material so to form a wetted inner diameter surface of the second hollow cylindrical target body;
- keeping positioning or positioning the backing tube, on which the first hollow cylindrical target has been bonded, vertically and coaxially within the inner diameter of the second hollow cylindrical target body so as to have the longitudinal axis of the second cylindrical target body being (substantially) parallel to the longitudinal axis of the backing tube, and forming thereby a second assembly made of the second hollow cylindrical target body having said its inner diameter surface being wetted (by said soldering material) and a second portion of the backing tube having a wetted outer diameter surface being at least partially, preferably fully, coated with a soldering material, said second portion being separated from the first portion by a predetermined separation distance, said second assembly having a (central) longitudinal axis and a second gap formed between the wetted outer diameter surface of the second portion of the backing tube and the wetted inner diameter surface of the second hollow cylindrical target body, said second gap being defined around said longitudinal (central) axis, said second assembly having a top and bottom open end accesses to said second gap, respectively positioned at a first and second extremities of the second assembly, said first and second extremities of the second assembly being opposed to each other. Optionally, the backing tube is positioned in such a way that its longitudinal axis is deviating from a reference axis perpendicular to a horizontal plane by an angle comprised between 0° and +/−5°, preferably between 0° C. and +/−2°;
- at least partially, preferably fully, covering the outer diameter surface of the second hollow cylindrical target body with a second electrically conductive material such as an electrically conductive film or an electrically conductive wrap, preferably with a removable and non-adhesive conductive film or wrap, more preferably with a carbon-based electrically conductive film or carbon-based electrically conductive wrap, said second electrically conductive material being removably connected to said outer diameter surface by a retention means or said second electrically conductive material being self-adhering to said outer diameter surface of the second hollow cylindrical target body;

positioning the second assembly internally within the inner diameter of the induction heater such that said second electrically conductive material is placed between said outer diameter surface of the second hollow cylindrical target body and said inner diameter surface of said induction heater;

pre-heating with the induction heater, through the presence of the second electrically conductive material, the second hollow cylindrical target body, or the second hollow cylindrical target body and the second portion of the backing tube, at a second temperature that is kept sufficient to maintain under a molten-phase a soldering material to be poured in said second gap so as to fill said second gap, said second temperature being preferably superior or equal to 180° C., more preferably superior or equal to 190° C.;

filling, through the top open end access of the second assembly, the second gap with a soldering material under its molten-phase, such as a molten indium-based material, between the wetted inner diameter surface of the second hollow cylindrical target body and the wetted outer diameter surface of the second portion of the backing tube; and heating with the induction heater, through the presence of the second electrically conductive material, said second hollow cylindrical target body, or said second hollow cylindrical target body and the second portion of the backing tube, of the second assembly along the longitudinal axis of the second assembly, such that a second axial temperature gradient is created from the bottom open end to the top open end of the first assembly, said second axial temperature gradient being a positive gradient oriented longitudinally and directed from the bottom to the top open end access of the second assembly, said second axial gradient being displaced/shifted longitudinally, from the bottom to the top open end accesses, so as to induces a cooling of the soldering material in the second gap, from the bottom to the top open end accesses, and creating a bond, from the bottom to the top open end accesses, between the inner diameter surface of the second hollow cylindrical target body and the outer diameter surface of the second portion of the backing tube, so as to form a rotary sputtering target having at least two cylindrical hollow target bodies bonded on the backing tube.

In this embodiment, the mechanism of bonding the second target body with the second portion of the backing tube is by analogy similar to the one explained in the embodiment 1 relative to the first process according to the present invention, and is further explained below.

The second axial temperature gradient is positive, which means that the temperature value increases from the bottom open access to the top open end access.

The second positive axial gradient is longitudinally oriented, which means that the temperature value increases from the bottom open access (bottom level) to the top open end access (top level) in a direction parallel to the longitudinal axis of the second assembly.

Optionally, the second axial temperature gradient is designed such that, for instance, the temperature measured at the bottom level of the second assembly is comprised between 25° C. and 150° C., preferably between 25° C. and 100° C., more preferably between 25° C. and 75° C., most preferably between 25° C. and 50° C. Alternatively, the temperature at the bottom level of the second assembly is, for instance, measured in a first defined area of the outer diameter surface of the target body or at the bottom edge of the second assembly/second body.

The temperature measured at the top level of the second assembly is comprised between 180° C. and 250° C., preferably between 190° C. and 200° C. Similarly, the temperature at the top level of the second assembly is optionally measured in a second defined area of the outer diameter surface of the target body, or at the top edge of the second assembly/second body.

In this embodiment, the mechanism of bonding the second target body with the second portion of the backing tube is, by analogy, similar to the one explained in the embodiment 1 relative to the first process according to the present invention, and is further explained below.

By modulating appropriately the operating frequency and power of the one (or more) induction heater during the heating step, the temperature profile between the bottom and top open end accesses can be adjusted in such a way that second axial temperature gradient, oriented longitudinally, is created from the bottom open end to the top open end of the second assembly and by further operating appropriately the one (or more) induction heater, said first axial temperature gradient is (progressively) shifted or displaced from the bottom to the top open access ends, inducing thereby the (progressive) cooling of the components: target body+backing tube's second portion.

The displacement or shift of the second axial positive temperature gradient can be ensured, for instance, by using one induction heater at an appropriate power and frequency and by displacing said induction heater along the longitudinal axis of the second assembly, in a direction defined from the bottom end to the top end and with an appropriate speed, so as to induce thereby the (progressive) cooling of the components: target body+backing tube's second portion.

Alternatively, a series of several induction heater can be used so as to form an edifice of at least two induction heaters, so as to fully encompass the second assembly in the induction heater edifice's inner diameter, and the shift or displacement of the second axial temperature gradient is obtained by modulating each of the induction heaters independently, so as to induce thereby the (progressive) cooling of the components: target body+backing tube's second portion.

To the second axial temperature gradient can be associated a second radial temperature gradient. This second radial temperature gradient is a negative gradient oriented from the outer diameter surface of the cylindrical hollow target body to the preferably centered longitudinal axis of the backing tube (to the inner diameter of the backing tube).

The combination of the second axial and radial gradients results in the creation of a second longitudinal gradient section crossing the second assembly along the longitudinal axis of said second assembly, said second longitudinal gradient section having its length being superior or equal to a predetermined length of the one (or more) induction heater; a width of said second longitudinal gradient section corresponding to a predetermined penetration depth length of the second radial gradient.

When said second radial gradient co-exists with said second axial gradient, during the heating step, it is the second longitudinal gradient section that is shifted/displaced from the bottom end to the top end of the second assembly, so as to induce a cooling of the soldering material in the second gap, from the bottom to the top open end accesses, and from the outer diameter surface of the second portion of the backing tube to the inner diameter surface of the first hollow cylindrical target body, thereby creating a bond, from the bottom to the top open end accesses, between the inner diameter surface of the first hollow cylindrical target body and the outer diameter surface of the second portion of the backing tube, so as to form said rotary sputtering target.

In the framework of this embodiment, the axial and radial first gradients are defined by the application of an appropriate frequency/power of the one (or more) induction heater and the presence of the first electrically conductive material that converts the radiation emitted by the one (or more) induction heater into heat.

Embodiment 23

The second process of forming a rotary sputtering target according to embodiment 22, comprising, prior the step of covering the outer diameter surface of the second hollow cylindrical target body with a second electrically conductive material, an additional step of:
- at least partially, preferably fully, covering the outer diameter surface of the second hollow cylindrical target body with a second protective material such as a protective film or wrap, preferably with a removable and non-adhesive film or wrap, more preferably with a polyimide-based film or polyimide-based wrap, said second protective material being removably connected to said outer diameter surface by a retention means or said second protective material being self-adhering to the outer diameter surface of the second hollow cylindrical target body, said step of at least partially covering of the outer diameter surface of the second hollow cylindrical target being performed before the step of filling the second gap with a soldering material, preferably, the step of at least partially covering of the outer diameter surface of the second hollow cylindrical target body is performed before the step of coating the inner diameter surface of the second hollow cylindrical target body with a soldering material.

Embodiment 24

The second process of forming a rotary sputtering target according to embodiment 22 or 23, wherein the backing tube is rotated and/or oscillated along its longitudinal axis during the pre-heating step and/or the heating step.

Embodiment 25

The second process of forming a rotary sputtering target according to any of embodiments 22 to 24, comprising, prior to the step of filling the second gap with a soldering material, a step of covering the bottom open end access of the second assembly with a covering means such as a seal, preferably a rubber seal.

Preferably, in this embodiment, after the step of heating, a step of removing said covering means from the bottom open end access of the second assembly.

Embodiment 26

The second process of forming a rotary sputtering target comprising, after the step of heating, a step of removing said second conductive material, preferably followed by a step of removing said second protective material.

Embodiment 27

The second process of forming a rotary target according to any of embodiments 22 to 26, wherein any of the steps of the embodiments 22 to 26 are repeated so as to form a rotary sputtering target presenting at least three target bodies bonded on said backing tube, preferably three to five target bodies bonded on said backing tube.

Embodiment 28

The second process of forming a rotary target comprising a step of selecting a first and/or a second cylindrical hollow target body that comprises a low conductive material chosen from a group consisting of: low alumina AZO, doped or undoped $Li_3PO_4$, undoped silicon, ZnO and lithium-containing transition metal oxides.

Embodiment 29

The second process of forming a rotary target, wherein said lithium-containing transition metal oxide is selected so as to have a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

Embodiment 30

The second process of forming a rotary target, wherein the $LiMO_2$ or $LiMM'O_2$ lithium-containing transition metal oxide is selected so as to have a Li/M or Li/(M+M') atomic ratio superior or equal to 0.90 and inferior or equal to 1.25, preferably superior or equal to 0.98 and inferior or equal to 1.05.

Embodiment 31

The second process of forming a rotary target, wherein the $LiMM'O_2$ lithium-containing transition metal oxide is selected so as to have a M'/M atomic ratio superior or equal to 0.001 and inferior or equal to 0.05.

Embodiment 32

The second process of forming a rotary target, wherein the $LiMO_2$ lithium-containing transition metal oxide is selected so as to have a general formula: $LiCoO_2$.

Embodiment 33

The second process of forming a rotary target, wherein is the $LiCoO_2$ formula is selected so as to have a Li/Co ratio is equal to 1.0+/−0.50.

Embodiment 34

The second process of forming a rotary target comprising a step of selecting a backing tube that comprises, preferably that is constituted of, an electrically conductive material chosen from the group consisting of: molybdenum, stainless steel, titanium, aluminum, and copper, or any alloys of said materials.

Embodiment 35

The second process of forming a rotary target, comprising:
- a step of providing a first (and optionally at least a second) wetted hollow cylindrical target bodies having an inner diameter, an inner diameter surface, an outer diameter, and an outer diameter surface, said first and second hollow cylindrical target bodies comprising—or consisting of an low electrically conductive material and thereby being a low electrically conductor bodies, said wetted hollow cylindrical target bodies having their inner diameter surface at least partially, preferably fully, coated with a soldering material such as an indium-based material; and
- a step of providing a heat-conductive (and electrically conductive) material-based wetted backing tube presenting an outer diameter and an at least partially, preferably fully, coated outer diameter surface with a soldering material such as an indium-based material, wherein the step of forming a wetted inner diameter surface of the first (and possibly second) cylindrical hollow target bodies and the step of forming a wetted outer diameter surface of the backing tube are skipped.

Embodiment 36

The second and/or first process(es) according to the present invention, wherein the longitudinal axis of the backing tube and the longitudinal axis of the first and/or second target body(ies) are parallel; optionally, the longitudinal axis are secant and forms an angle α with $0<\alpha \leq 5°$, preferably $\alpha=0°$.

Embodiment 37

The second and/or first process(es) according to the present invention, wherein the longitudinal axis of the backing tube and the longitudinal axis of the first and/or second target body(ies) are central and coincide so that the longitudinal axis of the first and/or second assembly(ies) is central.

Embodiment 38

The second and/or first process(es) according to the present invention, wherein the pre-heating step is performed so as to pre-heat the first and/or the second target body(ies)—or the first and/or second assembly(ies)—at a predetermined temperature that is sufficient (preferably between 180° C. and 190° C.), allowing thereby the molten soldering material, when poured into the respective first and/or second gap, to remain under its molten phase due to the radiative heat generated by the pre-heated first and/or second target body(ies) and/or the pre-heated backing tube (first and/or second portion(s) of said backing tube).

In the framework of the present invention, for the second and/or first process(es), the terms "removably connected" must be understood as: connected by a reversible bonding.

Embodiment 39

The second and/or first process(es) according to the present invention, wherein the pre-heating step is performed so as to reach a first and/or second pre-heating temperature(s) that is(are) superior or equal to 150° C. and inferior or equal to 250° C., preferably superior or equal to 180° C. and inferior or equal to 200° C.

Embodiment 40

The second and/or first process(es) according to the present invention, wherein the step of filing the first and/or second gap formed between the first (second) portion of the backing tube and the first (second) cylindrical hollow body target consist in a step of overfilling said gap with the soldering material, preferably with indium or an indium alloy, said soldering material volume under its molten-phase being exceeding of minimum 3% the gap volume.

In particular, the volume $V_m$ of molten soldering material to be poured in excess in the gap is equal to $0.03 \times V_G$, with $V_G$ being the volume of the gap.

Preferably, $V_m = 0.10 \times V_G$.

More preferably, $V_m = 0.15 \times V_G$.

Optionally, Preferably, $V_m = \xi \times V_G$, with ξ being an volume excess coefficient comprised between 0.03 to 0.20, more preferably between 0.03 and 0.15, most preferably between 0.03 and 0.10, including each of said minimal and maximal values.

Embodiment 41

The second and/or first process(es) according to the present invention, wherein the step of heating is performed at workable frequencies comprised between 1 to 100 kHz, and preferably 1 to 20 KHz, including said values.

More preferably, the frequencies range is between 6 to 12 kHz, including said values.

Optionally, the induction generator used in the induction bonding method is arranged to work under a power level comprised between 1 to 20 kW, and preferably 1 to 10 kW, including said values.

More preferably, the power range is between 1 to 3 kW or from 2 to 4 kW, or event from 1 to 4 kW, including said values.

It is understood that the present invention is by no means limited to the forms of the above embodiments and that many modifications can be made without departing from the scope of the appended claims.

BRIEF DESCRIPTION OF THE SEVERAL VIEWS OF THE DRAWINGS

FIG. 12 illustrates an induction heating initial stage under the present invention with an induction heater positioned over the protective and conductive material wrapped target body shown in FIG. 7C;

FIG. 13 illustrates the addition of a second target body cylinder or target segment on the backing tube above the lower, first positioned target body prior to induction heater repositioning away from the first target segment with the second target segment also having the (or a variation of the) wrapping shown in FIG. 7C;

FIG. 14 illustrates the arrangement of FIG. 13, but with the induction heater having been repositioned for the controlled axial gradient induction heating of the first and second target bodies;

FIG. 15 illustrates a completed target body assembly having multiple bonded target bodies on a common backing tube and with the induction heater having been removed and with the conductive wraps and protective wraps still in place.

DETAILED DESCRIPTION

Figure 1:
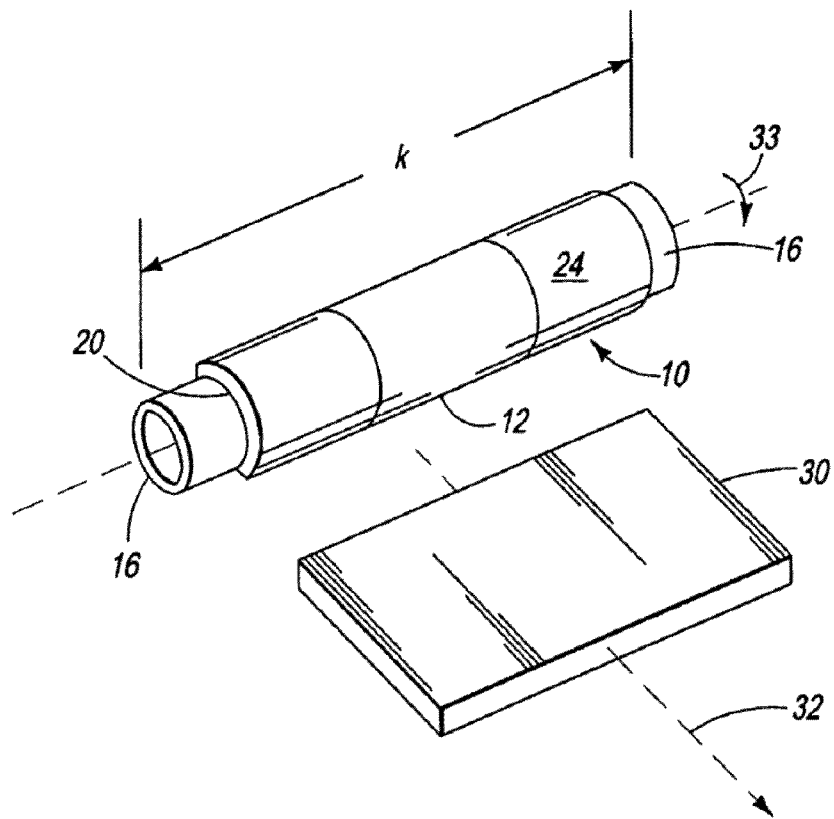
FIG. 1 is an isometric view of a cylindrical sputtering target assembly.

FIG. 1 shows a rotary, cylindrical sputtering target assembly 10 of the present invention (an assembly resulting from the sputtering target assembly methodology featured in the present invention) comprising the cylindrical sputtering target 12, cylindrical backing tube 16 and attachment means or attaching layer (e.g., solder bonding) 20. The sputtering target 12 includes the sputtering surface 24 which is a surface from which the material to be sputtered on the substrate can be ejected when the sputtering process begins. In the present invention, the length "h" of the cylindrical sputtering target 12 (shown in FIG. 2) is of sufficient length to provide the desired width of film coverage under the sputtering process (e.g., a range of about 0.5 (or 0.6) meter to 4 meters or greater). Additionally, the cylindrical sputtering target 12 has an outer diameter "D" (shown in FIG. 3) that is preferably greater than about 50 mm and more preferably is in the range of 75 to 175 mm.

Figure 2:
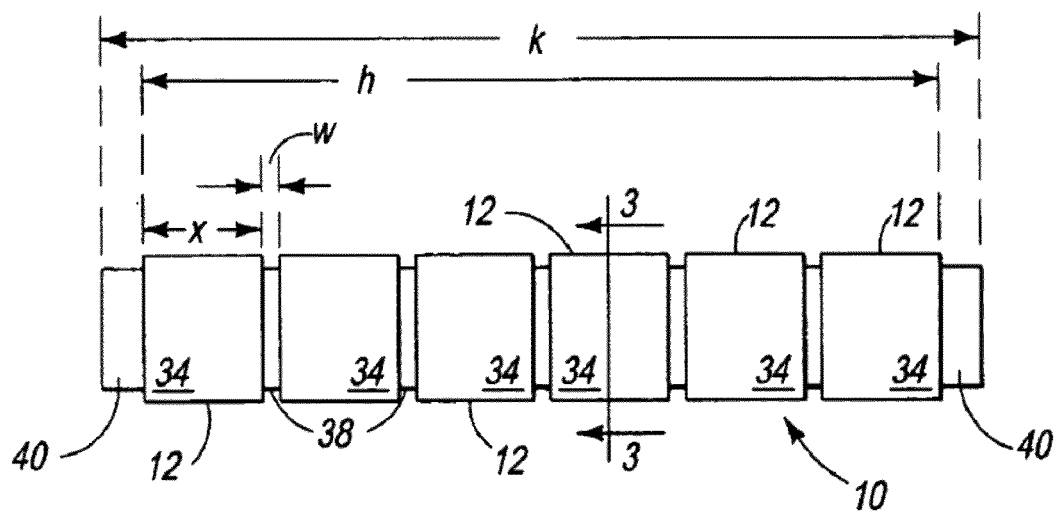
FIG. 2 is a side view of a cylindrical sputtering target assembly.

FIG. 2 illustrates that the sputtering surface 24 of the cylindrical sputtering target 12 is comprised of a plurality of individual cylindrical targets bodies or target segments 34. An axial gap 38 exists between each pair of adjacent targets 34. The axial gap 38 has a width "w" which is, for example, 0.15 to 0.55 mm, and is thus shown exaggerated in FIG. 2 for easier depiction. During manufacture of the sputtering target assembly the axial gap between respective, adjacent target bodies that are arranged in series along the backing support can be retained by way of fill members as in silicone gaskets (e.g., gaskets of silicone elastomer) which are suited for removal after attachment material setting.

As used herein, the length "h" of the cylindrical sputtering target 12 refers to the total length of the sputtering surface 24 in a single cylindrical sputtering assembly 10, regardless of whether the sputtering target is comprised of one piece of material or more than one piece. In other words, the length "h" includes the total of all of the lengths "x" of the individual cylindrical targets 34 when multiples segments are used. In view of the potential for the entire sputtering target surface to be based upon a monolithic target body or a plurality of target bodies, reference to "target" in the sputtering target assembly is inclusive of either scenario.

In FIG. 2, the length "h" is shown as including the widths "w" of the gaps 38, since the sum of the widths "w" is very small. This approximation is acceptable because the sum of the widths "w" is much smaller than the length "h." Notwithstanding this acceptable approximation, the length "h" of the cylindrical sputtering target 12 refers to the total length of the sputtering surface 24. The length "h" is less than the length "k" of the assembly 10 because an exposed section 40 of the backing tube 16 is shown extending beyond the last cylindrical target segments 34 on each end of the cylindrical sputtering assembly 10.

Each of the individual cylindrical target segments 34 (also called cylindrical sputtering target sections or bodies 34) is a cylindrical piece of material comprised of a sputtering target material. The individual cylindrical target segments 34 are hollow in the middle so as to accommodate the backing tube 16 and attachment layer 20 (shown in FIG. 3). The length "x" of the individual cylindrical target segments 34 can be of a variety of lengths suited for the intended sputtering application. As some representative examples, the length "x" is 0.1 to 1 m or greater and more preferably 150 to 500 mm. Additionally, the length "x" can be different for individual cylindrical target segments 34 and the number of segments can be verified to suit the intended end use (e.g., the sum providing a length "h" of 0.5 to 4 meters or more within a given cylindrical sputtering target assembly).

That is, by using a plurality of individual cylindrical target segments 34 having relatively short lengths "x", it is easier to build a longer cylindrical sputtering target 12 having the length "h" at or greater than, for example, the noted 0.5 to 4 meters. This is particularly true for certain sputtering materials like ceramic materials, where it is difficult (or not possible) to make a single cylindrical target body 34 where the length "x" is greater than, for example, 1 meter.

The cylindrical sputtering target 12 (and hence the individual cylindrical target bodies 34) can be comprised of many materials. Some typical sputtering target materials under the present invention include elemental materials (such as silver, silicon, copper, gold, tungsten, molybdenum and aluminum etc.), alloys (such as aluminum-copper alloy, aluminum-neodymium, indium-tin-oxide and titanium-tungsten alloy, etc.), and compounds (such as silicon dioxide, silicon carbide, ceramic materials such as $LiMO_2$ (e.g., $LiCoO_2$) and titanium nitride, etc.). In situations where the material is not particularly conductive as in silicon alone, a dopant can be added (as in boron doped silicon) to increase the conductivity. Embodiments of the present invention are particularly well suited for use with relatively lower conductivity material such as the ceramics and the undoped silicon noted above. Also, the material/resistivity table below illustrates some of the above described resistivity variations involved for target body materials.

| Material | Resistivity μΩ-cm |
|---|---|
| ITO 90/10 | 150-200 |
| AZO 97/3 | 698 |
| AZO 98/2 | 1,335 |
| AZO 99/1 | 5,683 |
| AZO 99.95/0.05** | 105,584 |
| LiCoO$_2$ | 500-5,000 |
| B-doped Si | 15,301 |
| Si*** | 2,300,000,000 |

Figure 3:
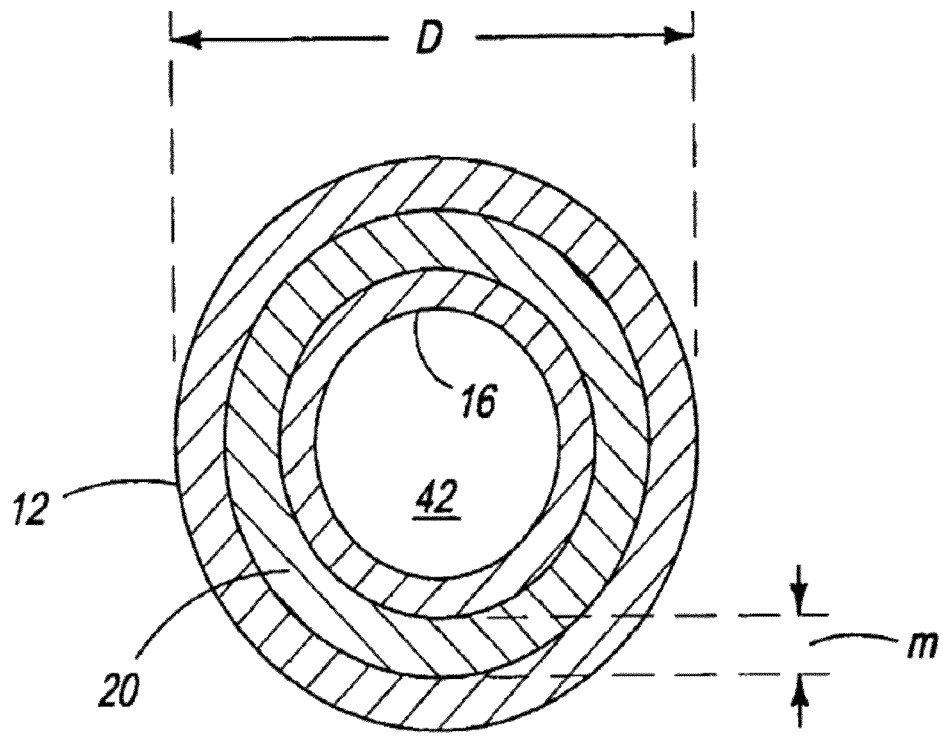
FIG. 3 is a cross-sectional view taken along the line 3-3 in FIG. 2.

*4-probe using MR 300C-A MicroOhmmeter from Schuetz Messtechnik
**500 ppm (doped-AZO)
***literature FIG. 3 illustrates that the attachment layer 20 (e.g., a bonding material layer as in solder, or some other means of attachment inclusive of conductive adhesive and filled elastomer) is positioned between the cylindrical sputtering target 12 and the backing tube 16, and that the attachment layer 20 has a width "m" that is preferably on the order of 0.5 to 2.0 mm as in 1.0 mm although other widths can be used. The backing tube 16 is a long hollow cylindrical tube that is strong enough to mechanically support the cylindrical sputtering target 12. The backing tube 16 includes a lumen 42 through which water or some other fluid can flow to act as a coolant for the cylindrical sputtering target 12. In a preferred embodiment, the backing tube 16 comprises stainless steel or titanium tubing, but other materials such as molybdenum, aluminum alloys, copper or copper alloys can be used.

Description of a Conventional Bonding Technique

In order to better appreciate the advantages/differences of the present invention over the prior art, a discussion below focuses on the process described in US 2007/0074969, published on Apr. 5, 2007 to Simpson et al. (hereafter "Simpson") relative to its radiative heating process used to attach its target rings to a metal backing tube. The disclosure of "Simpson's" US 2007/0074969 is also incorporated herein by reference in its entirety.

Figure 4:
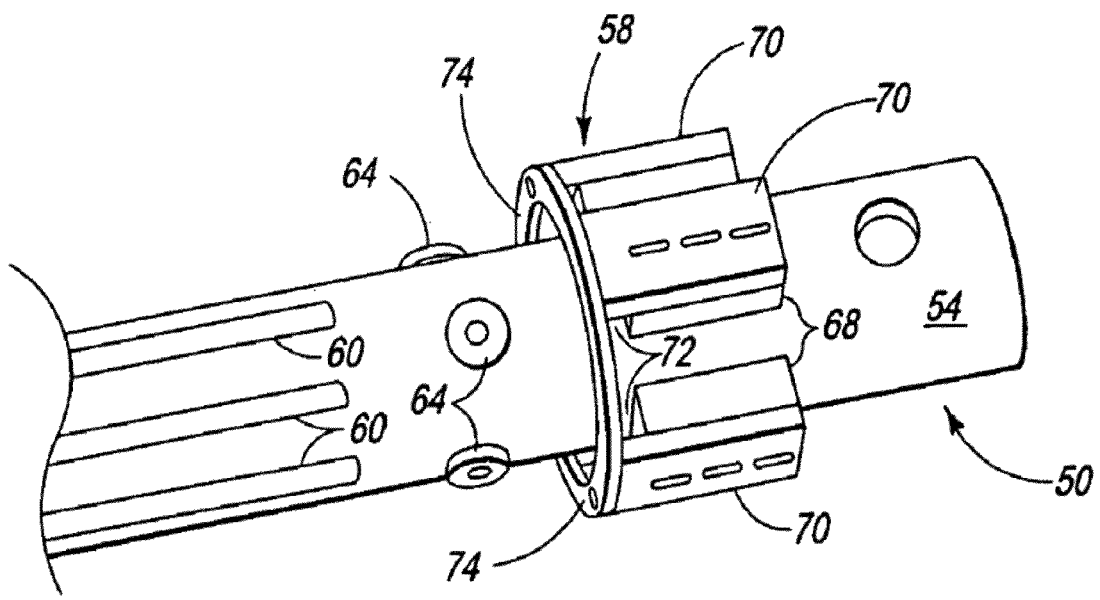
FIG. 4 is an isometric view of part of a conventional heating tube.

FIG. 4 of that publication (and presented in FIG. 4 in the present application for ease of reference) illustrates a heating tube assembly 50 that is used in manufacturing the cylindrical sputtering target assembly in Simpson (reference in the present paragraph being to the Simpson reference's figures). In Simpson, the heating tube assembly 50 comprises a hollow cylindrical metal heating tube 54, which is comprised of aluminum, a positioning fixture 58, a heating element 60 to provide the heat source for the heating tube 54, and a plurality of spacers 64. During the manufacturing process in Simpson, the heating tube 54 is inserted into the lumen 42 of the backing tube 16 to provide a radiative heat source to the backing tube 16. The heating element 60 comprises a plurality of tubular radiative heaters (e.g., eight tubular heaters, at 29 Watts/inch) that are positioned around the outside of the tube 54 extending parallel to the length of the tube 54. Alternatively, the heating element 60 is described as being of another type of heat source, as in the form of a wire coil wrapped around the tube 54. An electrical lead 62 (shown in FIG. 5) is electrically connected between the heating element 60 and control circuitry to provide electrical power to the radiative heating element 60. The spacers 64 create a space between the outside of the heating tube 54 and the inside of the backing tube 16 for the heating element 60 to sit in.

As further shown in Simpson's FIG. 4 (and also repeated in the present application for convenience as FIG. 4—although all reference numbers featured in this paragraph are in reference to the figures of Simpson's publication), the positioning fixture 58 is attached to the heating tube 54 (e.g., with bolts) and is used to align the target bodies 34 on the backing tube 16 during manufacturing. The fixture 58 comprises a backing tube stop 68 and a target stop 70 which is longer than the backing tube stop 68. The difference in length creates a space 72 into which the backing tube 16 can fit while it rests on the backing tube stop 68. The first target body 34 in the cylindrical sputtering target assembly 10 will rest on a surface 74 of the target stop 70 (see FIG. 5).

Figure 5:
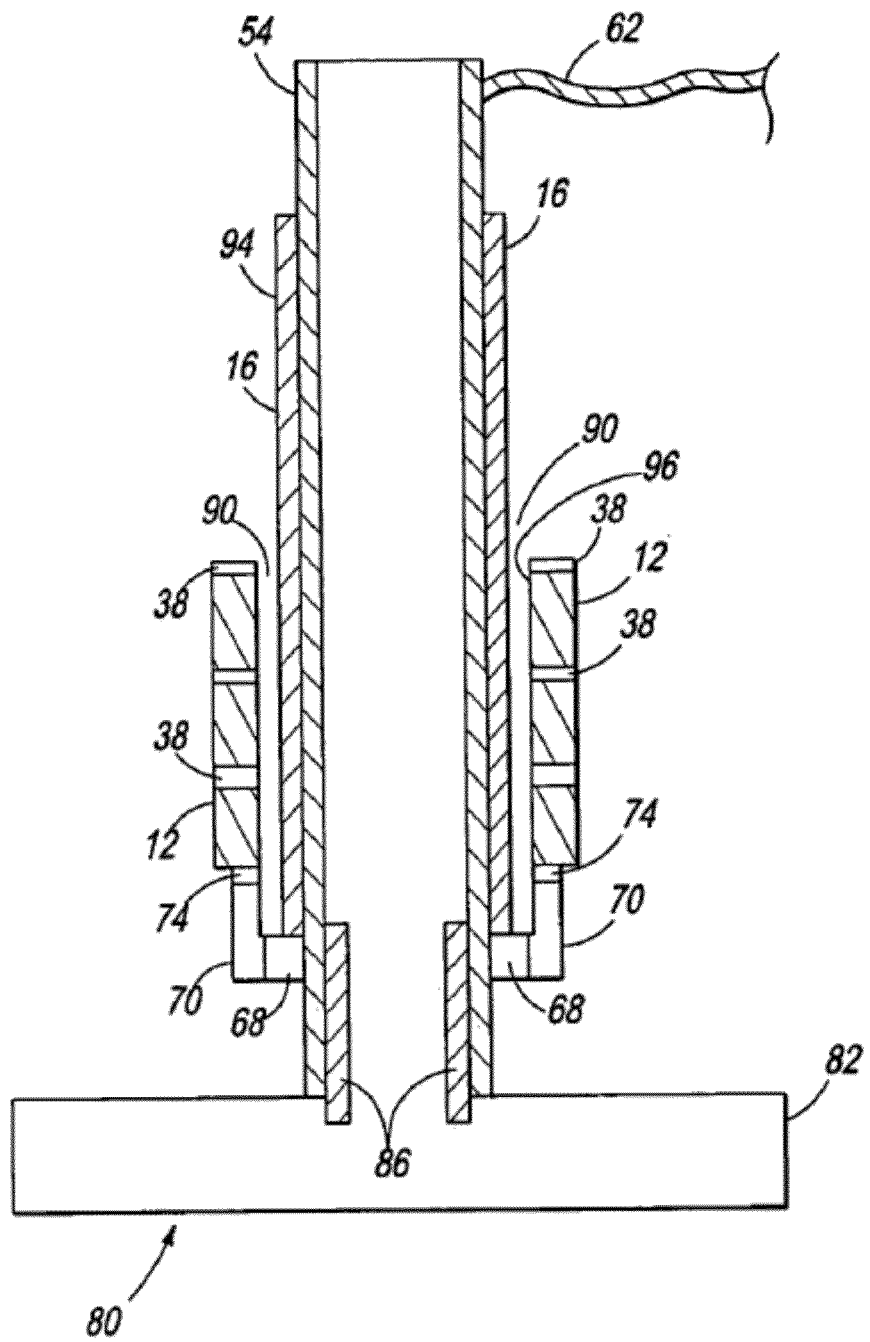
FIG. 5 is a cross-sectional view of a conventional cylindrical sputtering target assembly positioned vertically during sputtering target assembly.

FIG. 5 of Simpson (and also herein as FIG. 5, although all reference numbers featured in this paragraph are in reference to the figures of Simpson's publication) illustrates an assembly stand 80 that is used in manufacturing the cylindrical sputtering target assembly 10 of Simpson. The assembly stand 80 is comprised of steel and comprises a base 82 and a vertical fixture 86. During part of the manufacturing process, the vertical fixture 86 is inserted into the hollow inside of the heating tube 54 to hold the heating tube 54 and backing tube 16 in a vertical position while the attachment layer 20 is formed. The backing tube 16 is positioned with one end resting on the backing tube stop 68. Either while the backing tube 16 is positioned vertically on the stand 80, or earlier while the backing tube 16 is still horizontal, the target bodies 34 (preferably in groups of three) are slid over the backing tube 16 until the first target body 34 rests on the surface 74 of the target stop 70. At this point, a slot (space) 90 exists between the target bodies 34 and the backing tube 16 which will be filled with an attachment material. FIG. 5 of Simpson (and FIG. 5 herein) also shows an outside surface 94 of the backing tube 16 and an inside surface 96 of the cylindrical sputtering target 12.

Description of the Present Invention's Bonding Techniques

Embodiments of the bonding techniques of the present invention are provided below, and some of the differences relative to the bonding techniques of Simpson will become more apparent in the following discussion.

A. Preparation of Backing Tube and Target Segment(s)

Figure 8:
FIG. 8 illustrates a representative and schematic hollow cylindrical target body following formation into a ready to be assembled state on a sputtering target with exposed exterior surface.
Figure 8:
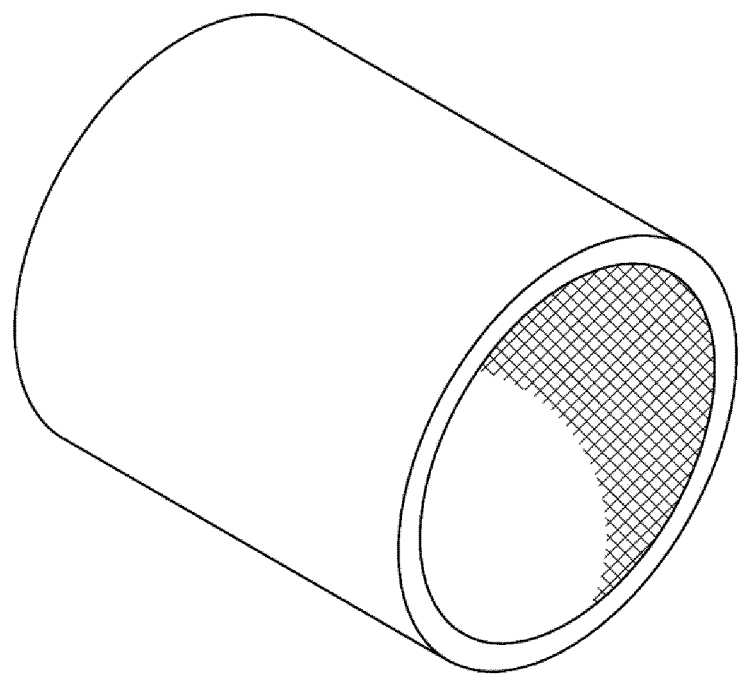

1A. If needed (i.e., if the condition of the sourced or formed target segment(s) suggests a need for cleaning), the present invention includes a step of cleaning the outside surface (or "OD") of the backing tube 16 and/or the inside surface (or "ID") of the cylindrical sputtering target (target bodies 34) 12 shown in FIG. 1 of the present application, such as by wiping with a solution with alcohol and/or acetone (good for oil removal). For example, there is featured under the present invention an internal target body surface cleaning of ceramic bodies such as LiMO$_2$ (e.g., LiCoO$_2$) with acetone prior to the below described wetting application step. Reference is made to FIG. 8 in this regard which shows a hollow, cylindrical target body suitable for use as a target segment in the formation of a sputtering target assembly as in one formed of multiple segments of the same configuration (e.g., sufficient sputtering target bodies such that when summed together with any gaps provides an overall length "h" that is sufficient to coat a predetermined substrate width). Thus, with target segments each having, for example, an axial length of 0.10 to 1 m (or more), and more preferably 150 to 500 mm, there can be summed a suitable number (as in 3 to 15 target segments) to meet the ever increasing lengths featured in sputtering systems. For example, an LiCoO$_2$ target body featured under the present invention preferably has an axial length such as one falling with the ranges described above (e.g., of about 200 mm), and an OD of about 75 to 175 mm (with FIG. 8 being an example of an OD of 153 mm), and an ID of about 50 to 160 mm (with FIG. 8 being an example of an ID of 135 mm); and a surface roughness of 0.2 to 3.0 microns (Ra) [the ID and OD surfaces of the target body can be of the same or different roughness, preferably still falling within the noted range, as in having the ID of the target body of a higher surface roughness than its OD to enhance wetting/bonding performance; the noted (Ra) surface roughness value can be determined using the standard test of JISB0601-2001], and/or a relative density range of ≥90% is preferred (as determined by an Archimedes' techniques such as described in ASTM C693: "Standard Test Method for Density of Glass by Buoyancy").

1B. In an alternate embodiment of the present invention and, if deemed needed, the surface of the backing tube 16 is modified in accordance with the stress reduction technique described in the noted Simpson publication.

B. Wetting the Inside Surface of the Cylindrical Target Segments

1. Under embodiments of the present invention there is included, as part of a wetting process, a protective wrap covering step that, unlike the prior art such as Simpson, avoids the potential for contamination of the cylindrical target bodies by contaminates generated by the protective wrap itself. For example, the outside surface of the target segments 34 (i.e. the sputtering surface 24), is protected under the present invention by covering the outside surface with a non-adhesive protective wrap material (e.g., a Kapton™ brand polyimide film (i.e., not a tape as in the prior art)). This avoids the potential for the presence of adhesive material in association with the target body OD surface that is being protective wrapped. That is, the protective film wrap technique of the present invention avoids the potential for adhesive material contact with the target body during the bonding process, and can be a full axial length protective wrap or a spirally wound ribbon of film such as the aforementioned Kapton™ film material. Other protective film wraps are featured under the present invention that preferably share characteristics like that of the Kapton™ film material such as flexibility and good direct contact surface retention over the entire contact area (e.g., significant wrinkle and bubble formation avoidance), and a capability to not degrade during the various process cycles during the sputter target assembly manufacture sequence (e.g., able to withstand, without problematic degrading, the heating stage with the induction heater). Embodiments of the present invention preferably feature relatively thin wrapping material as in one free of adhesive such as silicone. For example, a protective wrap film thickness at or below 100 μm as in about 75 μm, is illustrative with a polyamide (alone) film being suitable with such thickness to provide a protective function.

Also, in addition to the protective wrap providing a protective function during the bonding process, the same wrap can be retained in place as a protectorate during downstream stages, as in transport from a production facility to another location. In this way the protective wrap is multi-functional relative to protecting the target body. Also, as seen from the discussion below the ability for the protective wrap to be a material that can cover over the underlying surface below the surface wrap without air pocket development is advantageous in that upon, for example, usage of the below described conductive wrap, the avoidance of air pockets is advantageous from a standpoint of homogenous heating of the intended surface (e.g., the conductive wrap is also formed of a material flexible enough to avoid air pocket formation between it and the protective wrap if utilized).

When a protective wrap is utilized under the present invention, there is preferably also carried out an additional step of facilitating protective wrap position retention about the target body during the various subsequent stages of bonding (and the noted later downstream movement) by way of securing the wrap with retention means (e.g., such as a tape application to the exterior surface of the underlying protective wrap). For example the adhesive side of the tape (e.g., the adhesive silicone side in a combination polyamide-and-silicone laminate tape) can be wrapped about the full circumference of the underlying protectively wrapped target body as in a spiral or one or more spaced circumferential (tape rings) applications, since the protective wrap precludes any adhesive from the tape from contaminating the target body.

2. Under the general umbrella of wetting; the interior of the target body (when deemed desirable under the circumstances), is subjected to a pre-wetting preparation for improved wetting retention of the binder being used, such as by way of a blasting of the inside surfaces ID of the target segment (e.g., with 220 grit silicon carbide). Alternate techniques for pre-wetting preparation include, for example plasma treatment to activate the surface as in a plasma atmosphere of 10% $H_2$ in $N_2$. However, with cylindrical target bodies such as $LiMO_2$ material (e.g., the $LiCoO_2$ target body represented in FIG. 8 of the present invention), there is avoided a need in most situations for a pre-wetting preparation step (e.g., there is avoided the need for a sand blast and/or plasma generation step), while still retaining a good wetting application on the inside surface of the $LiMO_2$ (e.g., an $LiCoO_2$ representative cylindrical target body segment such as that shown in FIG. 8).

3. If sand blasting (or plasma activation) is carried out there is preferably added another interior cleaning step of the inside surface ID of the target segments, such as by blowing off the dust with air and then wiping the surface with alcohol or the like. An advantage of avoiding the pre-wetting activation step 2 (and hence step 3) relative to cylindrical targets such as $LiMO_2$ material cylindrical target bodies (e.g., the $LiCoO_2$ target body shown in FIG. 8) is that it avoids additional issues that may arise such as may be associated with the added dust that is generated and blown around in the region of the target.

4. Under an embodiment of the invention, the target body is heated in a standard furnace (e.g., a simple box furnace) or otherwise heated to a wetting application temperature of, for example, 200° C. While the indium is still about at 200° C., the entire inside surface ID of the single target segment 34 is coated with molten indium by spreading the indium with a brush followed by treatment over the brushed surface with an ultrasonic tool so as to wet the inside surface ID of the single target with indium or other bonding material. Relative to the FIG. 8 $LiCoO_2$ (an $LiMO_2$ illustrative embodiment) target body, this material is wetted without pre-wetting activation without issue (e.g., there was carried out an Indium-to-Indium stick test to assure that there was good wetting without an activation step and good wetting adhesion was verified in that there was a failure of the $LiCoO_2$ ceramic prior to the Indium-to-Indium bond failing).

5. Following wetting application to the ID of the target body and confirmation of a good coating, there is verified that the entire inside surface of the single target body has been sufficiently wetted (coated) with the wetting material such as indium, and there is visually verified that there are no areas not coated with the wetting material (dry spots). Then the "wetted" target segment is allowed to cool to room temperature. In an alternate embodiment of the invention there are intentionally formed distinct areas in the interior surface that are selectively superficially treated as to enhance the bonding strength in any of the manners described in U.S. Publication No. 2013/0118898 (US '898) published May 16, 2013 to the same Applicant and which is incorporated by reference. This can involve areas of non-wetting and wetting as explained in the US '898 reference.

C. Wetting the Outside Surface of the Backing (Support) Tube

1. Under the present invention the ends of the cylindrical backing tube 16 are also protected from contamination, e.g., by covering the ends of the backing tube with Kapton™ brand polyimide tape. In this case adhesive tape can be applied as it is easier to fix in position and there is less of an issue with adhesive material removal on the backing tube. Alternatively, there can be utilized the non-adhesive protective film and preferably the external tape retention (as described for the outside diameter surface of the target segments) to the target tube as well.

2. The regions of the backing tube not to be protected are subject to activation such as a plasma step like that described above. Alternatively, although less preferably due to dust generation, the outside surface (OD) of the backing tube 16 is blasted with grit in a manner such as referenced above.

3. If activated, the outside surface OD of the backing support is cleaned again, such as by air blasting the dust off the outside surface of the backing tube, and wiping down the backing tube with alcohol.

4. The backing tube of the present invention is placed inside a furnace and heated to 200 C.° for improved wetting application.

5. Following heating of the backing tube to the desired temperature, there is carried out a wetting step such as the application of a quantity of indium to the outside surface (OD) of the backing tube.

6. While the indium is still sufficiently hot (e.g., about at the 200 C.°), the entire (non-protected covered) outside surface (OD) of the backing tube is coated with bonding material such as molten indium by spreading the indium over the outside surface with a brush followed by an ultrasonic application such as the ultrasonic horn noted above. While spreading the indium, there is applied ultrasonic energy to the ultrasonic tool (horn) to cause the indium to adhere to the backing tube (i.e., to wet the outside surface (OD) of the backing tube with indium).

Figure 16:
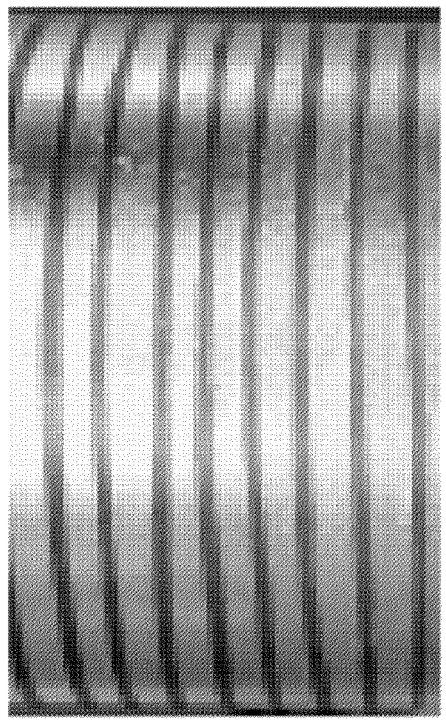
FIG. 16 illustrates two different front view schematic representations illustrating an arrangement of backing tube with wetting layer pattern.
Figure 16:
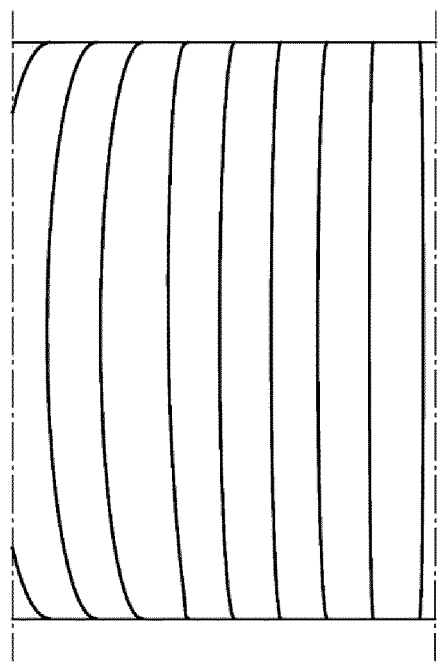

7. While the backing tube is still warm, there can be verified that the entire outside surface of the backing tube has been wetted (coated) with the wetting material such as indium in similar fashion to the verification step related to the target body ID. Also, there is preferably visually ensured that there are no areas not coated with the wetting material (dry spots). Then the backing tube is allowed to cool to room temperature. In an alternate embodiment, there is carried out the selective, superficial treatment to the outside diameter of the backing tube in accordance with the aforementioned incorporated by reference U.S. Publication 2013/0118898 (either in conjunction with a similar treatment of the ID of the target body or as an alternative thereto). In this case a visual inspection, like with the target body, can be carried out to confirm appropriate areas of wetting and non-wetting have been formed. FIG. 16 illustrates an example of a backing tube subjected to the noted process in US '898.

D. Preparing the Target Body(ies)/Segment(s) and Support Backing Tube for Bonding and Bonding of the Same With the wetted target body prepared in a preferred manner of the present invention as described above, and the same with the wetted target tube, there can be initiated the assembly of the target body assembly through bonding of the components. A preferred embodiment features individual target body bonding (one at a time along the length of the tube) as this provides for improved visual and physical access, and improved control over the axial and radial temperature gradients from one target body to the next (e.g., the lower region of a lower target body can be gradually cooled by a gradual adjustment of the induction heater away from a maximum heating state on that now to-be-cooled target segment). In other words, an earlier now to-be-set target body can be subjected to less induction heat transfer due to relative movement of either one or both of that target segment and an associated induction heater.

Also, in conjunction with attaining the relative circumferential spacing within the circumferential gap to be filled with attachment material (e.g., a gap either free of wetting material or more preferably already defined by wetting material as in wetting material on either or, more preferably both, of the target body and backing tube), there can be positioned circumference retention spacers as in small diameter wires or the like that can be placed in position at multiple gap locations about the gap circumference at a time when filler bonding is to be supplied. These circumference spacing means can either be left in position or removed (preferably removed) before the bond material has solidified completely.

Figure 6A:
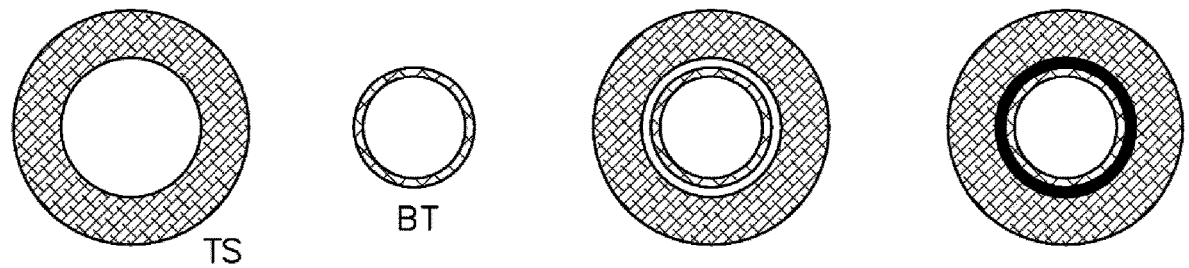
FIGS. 6A and 6B illustrate a conventional sequence for binding a hollow ceramic cylinder sputtering target segment to its backing tube in front elevation and top plan respective orientations.
Figure 6B:
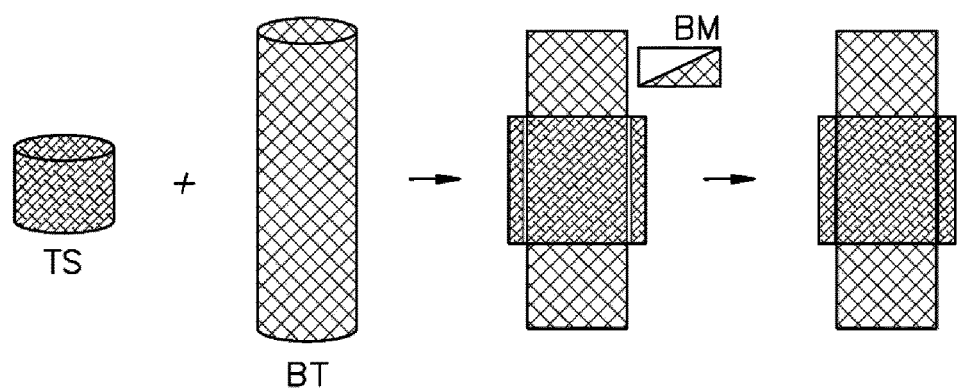

FIGS. 6A and 6B illustrate, schematically, a conventional sequence for binding a hollow ceramic cylinder sputtering target segment (ST) to its backing tube (BT) in front elevation and top plan respective orientations. A discussion of this conventional sequence can be found in US Publication No. 2013/0118898 (US '898). As noted above, in addition to describing a conventional bonding technique as represented in FIGS. 6A and 6B, this reference describes a bonding enhancement technique that can also be incorporated into the binding process of the present invention (optionally, since embodiments of the invention also feature methods and resultant target assemblies without the noted bonding enhancement technique explained in the incorporated '898 U.S. Publication).

That is, FIGS. 6A and 6B illustrate the known principle of bonding a rotary target wherein a target segment (TS) is inserted about the backing tube (BT), and then solder or other gap filling bonding material (BM) (molten indium or another low melting temperature alloy) is poured in the intermediate space between both cylinders that are heated to (and possibly above) the bonding material's melting point. Thereafter, the target assembly is cooled down to room temperature.

In US '898 there is carried out a bonding enhancement treatment wherein the attaching surface and/or the carrying surface of the target segment and backing tube are selectively, superficially treated to enhance the bonding strength of said bonding material in distinct areas. An example of a superficially treated enhancement on a backing tube is featured in FIG. 16 which shows the carrying surface of the backing tube partially wetted so as to obtain a spiral pattern as illustrated in FIG. 16 [two views are illustrated in this specific embodiment] (with ring shaped selective wetting layers), where between 50 and 80% of the carrying surface is selectively wetted with an indium layer using the sonotrode method (said sonodrode method being an ultrasonic-based method well-known by the skilled person). The width of each wetting ring is between 6 and 20 mm, the width of each non-treated surface ring is between 2 and 6 mm.

Again, the present invention is inclusive of bonding with such additional treatment steps as well as without, as the present invention is suited for generation of high quality sputtering target assemblies in many instances without an enhancement step such as featured in US '898.

Figure 7A:
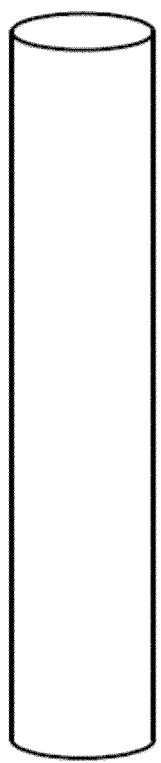
FIGS. 7A, 7B and 7C illustrate some of the steps featured under the present invention's bonding technique.

Unlike the radiative heating systems, such as illustrated in FIGS. 5 and 6 from the Simpson reference, the present invention uses a different technique to join the target body(ies) to the backing support as illustrated in FIGS. 7A to 15. FIGS. 7A, 7B and 7C illustrate some of the steps featured under the present invention's bonding technique. FIG. 7A shows a backing tube (e.g., a titanium cylindrical tube) having dimensions suited for providing the aforementioned gap spacing relative to the encompassing target body(ies) during bonding and is of a length and thickness sufficient to carry out the above described backing support and thermal transfer functioning while in use in a sputtering apparatus.

Figure 7B:
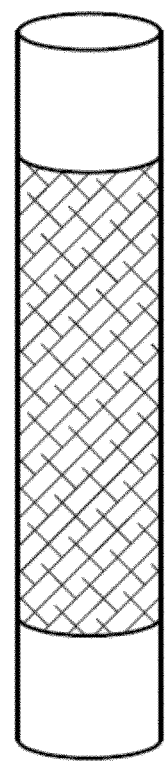

FIG. 7B shows the backing tube BT, which is designed for use with the aforementioned target segment TS, following wetting in a manner such as described above in the "wetting" section. There can be seen in FIG. 7B the non-wetted, end regions which are suited for mounting within, for example, appropriate sealed bearings of the rotating region of a chambered sputtering device.

Figure 7C:
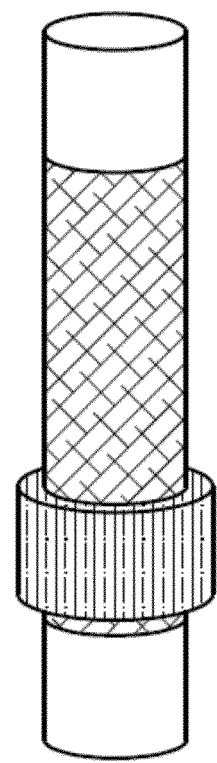

FIG. 7C further illustrates the positioning of a first, in this case lowermost, wetted cylindrical target body TB or segment TS relative to the wetted backing tube BT. The target segment in 7C is retained in the desired position by any suitable means as in a connection support structure positioned below it and temporarily attached to the backing tube (inclusive of support brackets such as shown in Simpson).

FIG. 8 illustrates a representative hollow cylindrical target body (e.g., following CIP densification and sintering formation steps and machining into a ready to be wetted (and subsequently assembled) state on a sputtering target assembly backing support) with an exposed ceramic exterior surface (preferably after acetone wiping and prior to the below described protective wrapping). For example, the FIG. 8 target segment is in an un-wetted state but otherwise ready for assembly (either directly or with the addition of a protective wrapping as described herein). The FIG. 8 cylinder is representative of a CIP-densified and sintered $LiCoO_2$ cylindrical target body (derived from $LiCoO_2$ raw powder sourcing) that results in a CIP densification based grain arrangement in the final molded cylindrical target body. The cylindrical sintered molding can also be machined in standard fashion to a desired configuration and surface roughness (e.g., less than 3 micron (Ra)). As an example, of differences in the coefficient of thermal expansion ("CTE"—linear) in material like $LiMO_2$ and a metal backing tube, it is noted that the CTE of titanium is 7-9 while the CTE of a material like $LiCoO_2$ is 11.5.

Figure 9A:
FIG. 9A illustrates the target body of FIG. 8 following addition of a protective wrap which in this embodiment is shown as a translucent protective wrap about the exposed outer diameter surface of the target body.
Figure 9A:
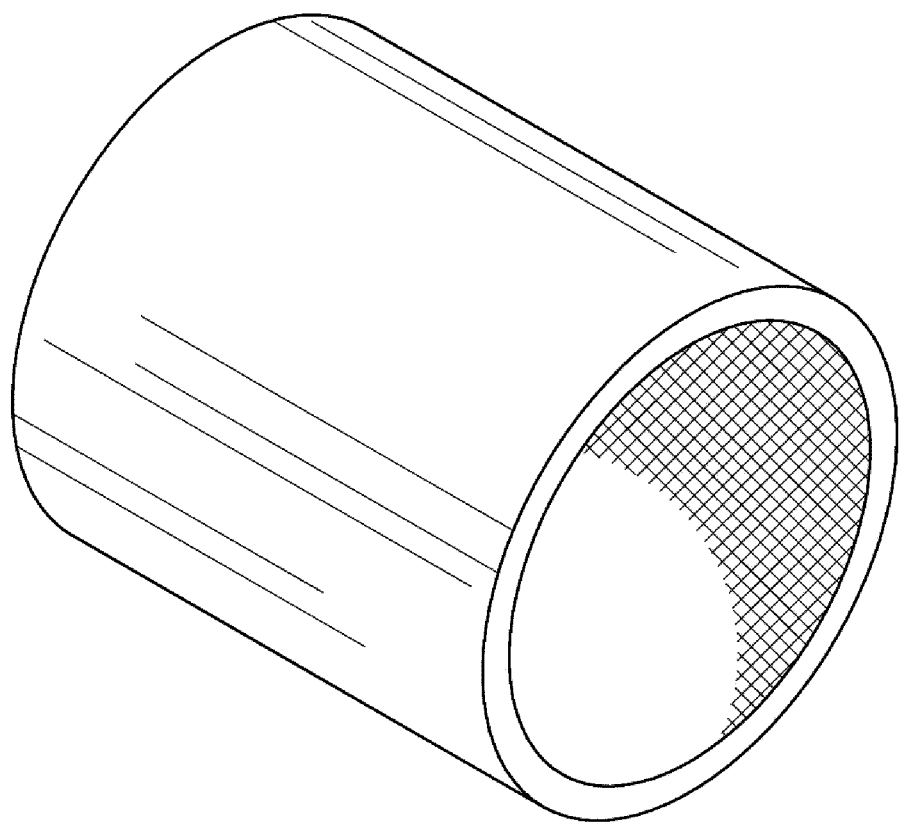

FIG. 9A illustrates the target body or segment TS of FIG. 8 following addition of a protective wrap PW which in this embodiment is shown as a translucent protective wrap about the exposed outer diameter surface (e.g., a wrap of a minimal thickness as in of 50 to 100 μm, and more preferably about 75 μm). In the embodiment shown in FIG. 9A there is featured a ribbon film (e.g., 2 to 24 inch width (a width that is preferably less than the segment for enabling helical winding) as in 6 to 20 inch and more preferably 10 to 12 inch width ribbon) such as of Kapton™ film (not tape and thus free of adhesive material that might be received by the target body) that is wrapped (as in a spiral overlap fashion) so as to cover over the entire exposed surface OD of the target body. That is, from end edge to end edge along the entire axial length of the target body. The ribbon material can be, for example, rolled off from a larger source roll, and cut after a desired wrapping end length is reached which covers the entire target body outside diameter surface with one or more circumferential wrap applications or laminate layers. A translucent or transparent material is preferred as it facilitates a visual inspection of the underlying target at least to some degree.

Figure 9B:
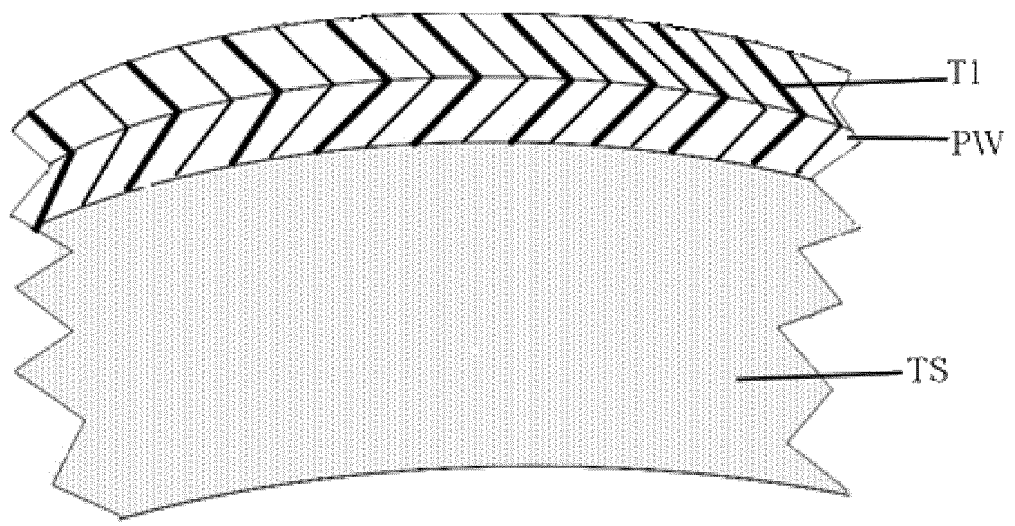
FIG. 9B illustrates a schematic depiction of a portion of the target body in FIG. 9A with protective wrap covering and tape retention lamination.

FIG. 9B illustrates the same protective film covering in cross section together with added protective wrap retention means T1 which in this embodiment is in the form of an adhesive tape helping to retain the PW in direct contact with the target segment TS (the tape T1 in this embodiment preferably has its adhesive surface in direct contact with the PW as shown in FIG. 9B). As the tape T1 is subjected to the below described induction heating process, it should be formed of a material suited for such an environment as in a polyamide film with adhesive such as silicone (i.e., a tape formed of a polyamide layer and silicone adhesive coating such as that featured in Kapton™ Tape). The tape T1 application also facilitates the avoidance of air pockets between the PW wrap and underlying target segment TS.

Figure 10A:
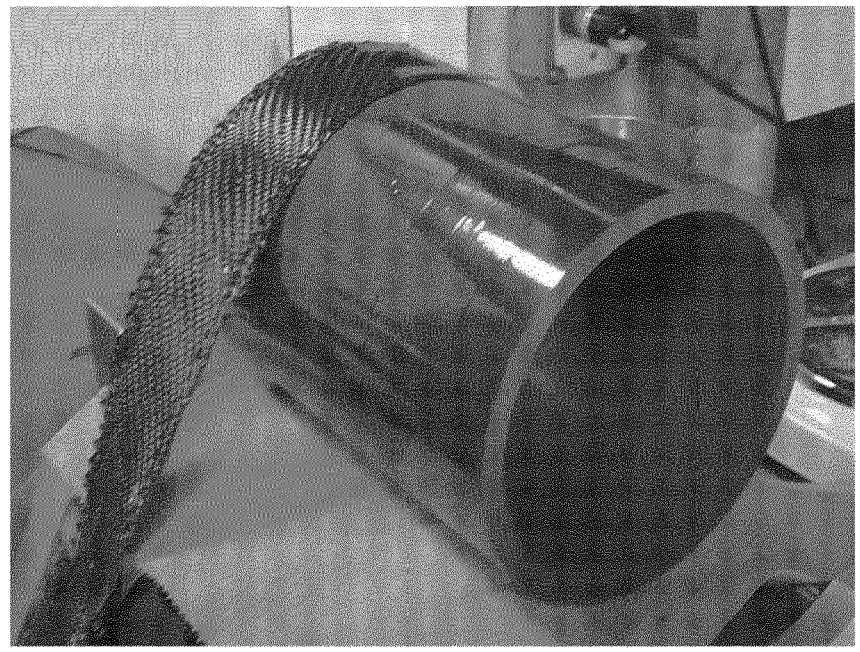
FIG. 10A illustrates a first view of initiation of application of a conductive wrap about the previously protectively wrapped cylinder of FIG. 9A.
Figure 10A:
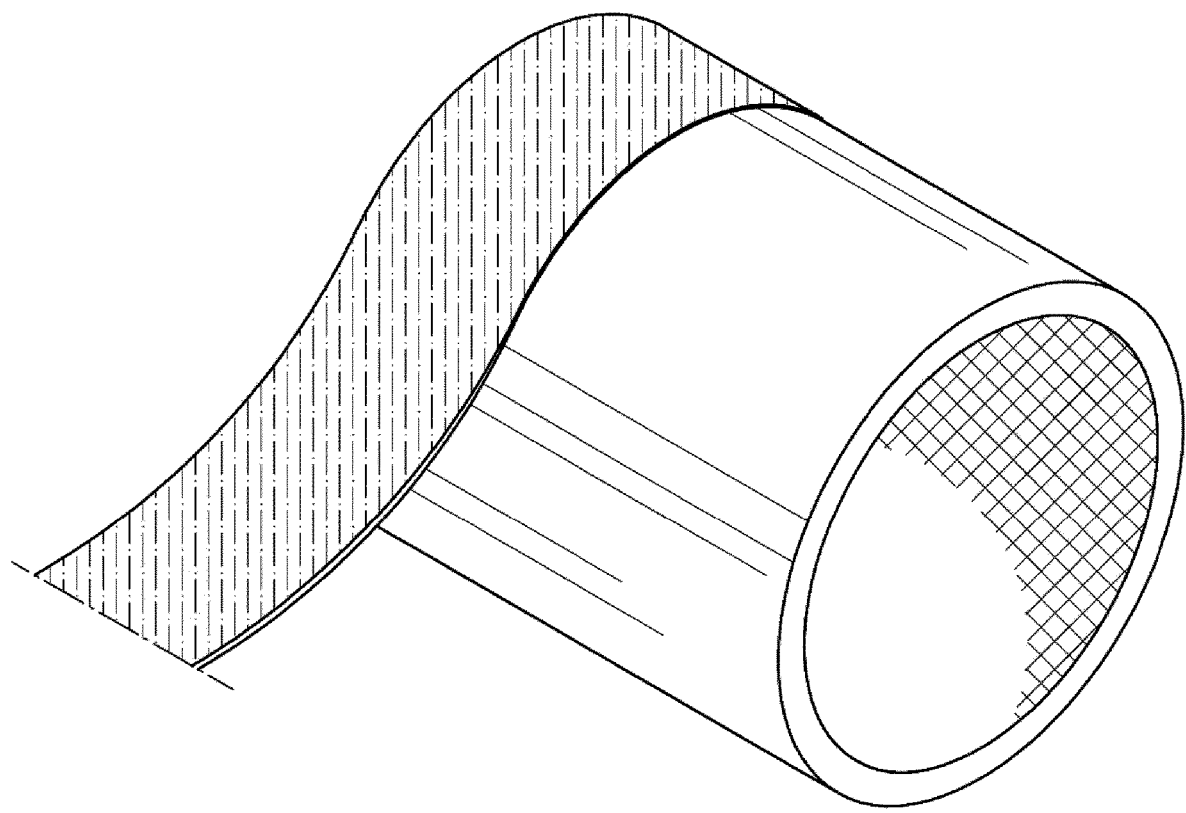
Figure 11:
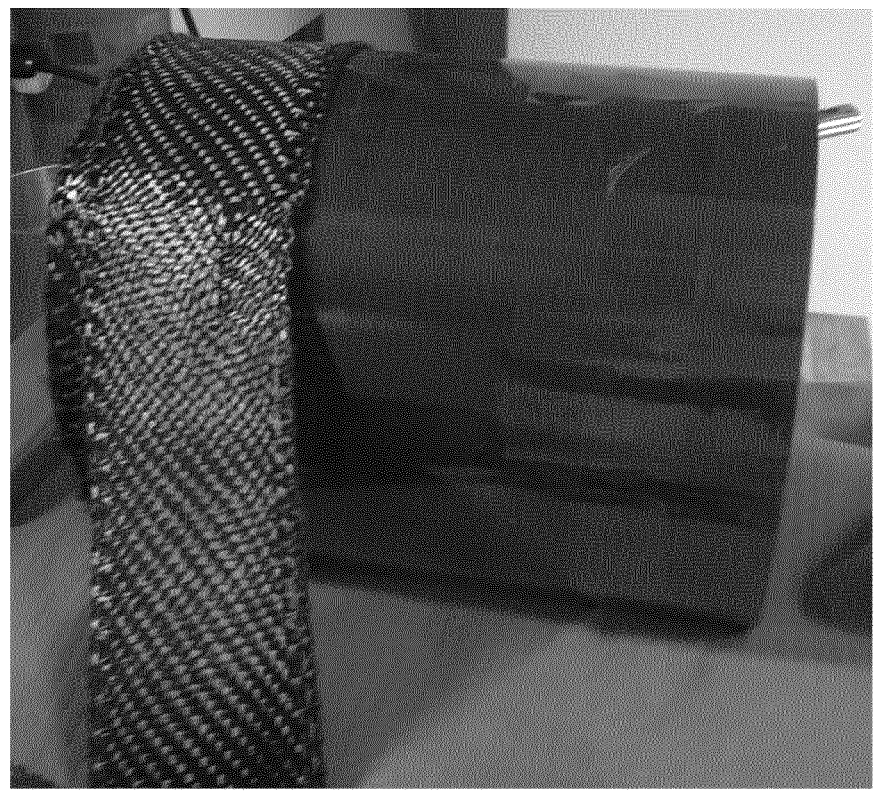
FIG. 11 illustrates that which is shown in FIG. 10A from an alternate viewpoint with the conductive wrap being wound in helical fashion around the protected cylindrical target body of FIG. 9B.
Figure 11:
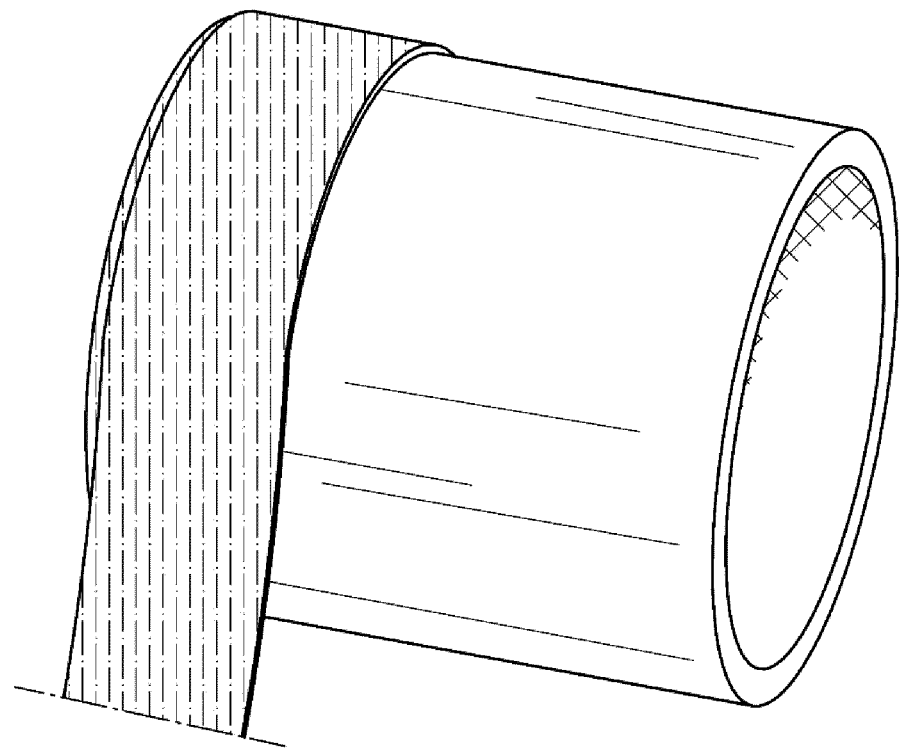

FIGS. 10A and 11 illustrate views of the initiation of application of a conductive wrap CW application about the previously protectively wrapped cylinder of FIG. 9A, although in alternate embodiments the protective wrap can be dispensed with and the CW layer directly applied to the target body surface. The CW wrap should be of a material that is sufficiently flexible as to provide for a minimization of air pocket formation relative to the underlying surface of the protective wrap or the target body OD surface. For example, the CW layer should be flexible enough as to achieve, for example, 90% full contact with the underlying laminate surface and more preferably 99% full contact coverage. Further, the thickness of the wrap is preferably relatively low (e.g., 0.3 to 0.5 mm) as to facilitate wrapping without too much of an increase in OD of the combination even if there is multiple laminate wrapping as in 1-5 wraps or (1 to 5 times the CW thickness potentially). In a preferred embodiment the conductive material is a ribbon wrap conductive fabric material as in one having a ribbon width of about 40 to 80 mm (e.g., 60 mm).

The use of a protective wrap is particularly desirable in some circumstances such as when there would be the potential for staining, or undesirable chemical reactions, between the material in the conductive wrap and the cylinder body (e.g., carbon staining of $LiCoO_2$ when utilizing a carbon based conductive wrap without a protective wrapper layer). The conductive wrap in this embodiment has the above attributes and is also preferably in ribbon format (e.g., the aforementioned conductive carbon fiber fabric sheeting with widths such as those described above for the CW wrap that have sealed fabric edges. For example, if a ribbon wrap CW is utilized, it can be overlapped in helical fashion. The ("applied radial") thickness is preferably sufficient to maintain the noted flexibility while attaining the noted induction sourced heating utilized to achieve the desired temperature in the bonding process.

One advantage associated with a ribbon conductive wrap is that it provides greater flexibility in an axial temperature gradient to retain, for example, a gradual hotter-on-top/cooler-on-bottom bond set relationship following target body/backing support gap filling with attachment material such as bonding metal solder (e.g., indium and indium alloys). For example, an increased degree of overlap percent in the CW material travelling up the target body or an increased circumferential wrapping amount as the ribbon is supplied to the target body can provide for CW driven imposed axial temperature gradients well suited for the bonding situation. The wrap itself can have a varying degree of conductivity along its length such as by varying the amount of conductive material it contains along the length (as in different carbon filaments or powder percentage amounts).

Also, a similar different axial temperature gradient theme (e.g., gradual hotter on top-cooler on bottom) can be implemented by providing more wrap material from one target segment to the next in a multi-segment embodiment like that described below, as in an induction heating set up featuring a lower-one CW wrap thickness/an intermediate-double CW wrap/and a top-triple CW wrap sequence). The same axial variation can also be carried out by using, for example, different weights in the conductivity of material amount of the wrap material from one wrap to the next. The conductive wrap is also preferably wrapped about the entire OD of the target segment and retained in position with retaining means as in a tape T2 (e.g., a tape that is similar to tape T1 used for the protective wrap PW and which retaining means is positioned to help retain the relative position of the conductive wrap to the target segment TS (and PW if present) and to help avoid air pocket separation between the conductive wrap CW and the surface to which the CW is in contact. Also, in an alternate embodiment there is retention means only placed about the CW which fixes in position both the underlying protective wrap and conductive wrap at the same time.

The conductive wrap may optionally be removed during the solder solidification process to assist cooling and accelerate the cooling process. The conductive wrap may be preferentially removed from the bottom of a target segment to promote a gradual bottom-to-top cooling of the heated portion of the assembly.

Figure 10B:
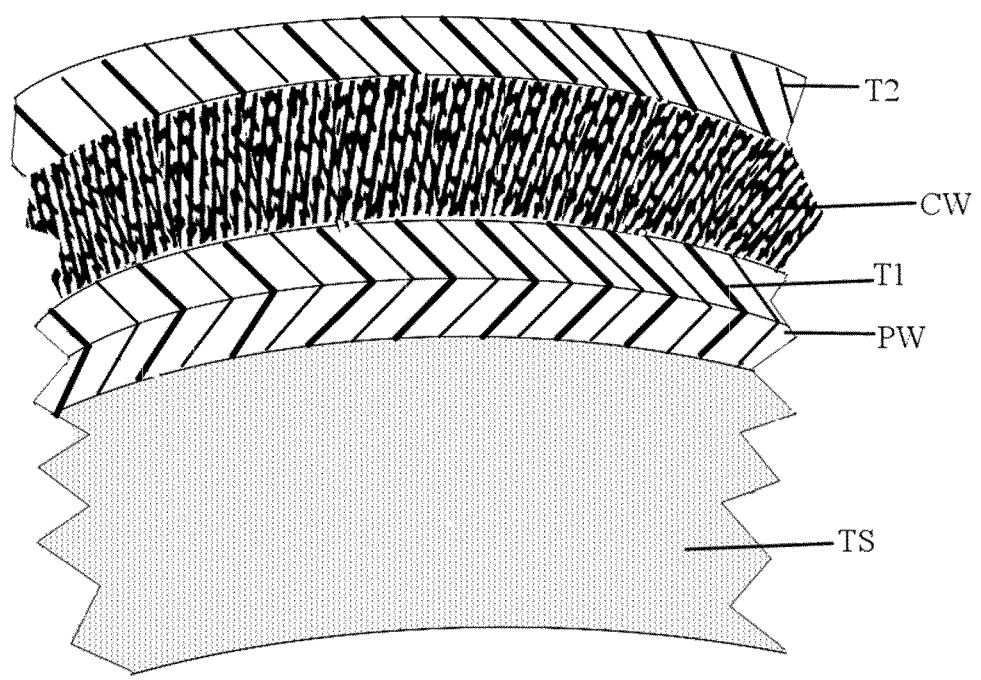
FIG. 10B illustrates a schematic depiction of a portion of the target body in FIG. 10A with an intermediate protective wrap covering and exterior conductive wrap covering over that portion of the target body, each with tape retention means.

FIG. 10B illustrates the target body, protective wrap, first tape, conductive wrap, second tape layering or laminate arrangement featured in an embodiment of the invention. With each added layer over the target body OD being relatively thin, the combination is sufficiently thin as to provide for the desired circumferential spacing between the interior of the induction heater and the OD of the entire combination. For example, starting with the OD of the target body as the foundation, there can be present a thin layer of protective wrap (e.g., one that is at or less than 100 µm), a thin layer of tape (e.g., less than or equal to 75 µm), a thin conductive wrap layer or layer set (e.g., a single layer less than or equal to 2 mm (as in 0.25 to 1 mm per layer and more preferably 0.3 to 0.5 mm per CW layer) such that, even with a multi-wrap arrangement in the conductive wrap, for example a 5 wrap embodiment, a total CW wrap thickness range of 1.25 mm to 10 mm is presented for a 0.25 to 2 mm one CW layer thickness range). As an additional example, a CW is utilized that has about a 0.4 mm thickness (such that a 3 wrap embodiment results in a 1.2 mm addition).

A conductive wrap retainer means such as additional tape T2 like that described above can also be added such as one formed of the same tape T1 material noted above (e.g., an additional 75 µm or less). Thus, in the embodiment described above, a summed total of the values for a 2 mm thick CW wrap features a range of 2.25 mm (1 CW wrap) to 10.25 mm (5 CW wrap) for the various (up to 5 wrap) arrangement. Thus, in the alternate embodiment described featuring about 0.4 mm thick CW, there is a range of 0.65 mm (1 CW wrap) to 1.45 mm (3 CW wrap) in overall thickness. Embodiments of the invention preferably feature an overall combination thickness out from the target body external surface (inclusive of 3 wrap embodiments) of 0.5 to 3.5 mm combination radial thickness.

FIG. 7C shows this protective wrap and conductive wrap (previously wetted) target segment positioned on the previously wetted target tube and ready for induction heating initiation.

FIG. 12 illustrates an induction heating initial stage with an induction heater positioned over the protective and conductive material wrapped lowermost target body shown in FIG. 7C. Once the wrapped target segment TS is properly situated on the backing tube BT and the induction heater IH in the desired relationship (e.g. circumferentially surrounding the target body's lower region as a start off location to facilitate obtainment of a desired axial temperature gradient schedule), there can be carried out a bonding of that lowermost target segment or body TS to the backing tube BT through use of an induction heating process and providing bonding material sufficient to fill in the attachment gap.

That is, as shown in FIG. 12, induction heater IH with control unit CU (with frequency and energy setting means (e.g., dials or touch screen setting options)) placed at a desired setting relative to the featured materials for the target body, backing tube and binding material (e.g., metal solder such as Indium) is properly set. Also, as shown in FIG. 12, the size of the induction heater can be made to have a height generally conforming to the target body (e.g., about the same (100%) or less than (40% to 80%) to facilitate visual and physical access if needed). However, in view of the potential for different axial length target bodies, the induction heater should not be made too small in axial length (e.g., too much heat adjustment time) or too long in axial length (loss of accessibility or precision axial gradient control). Also, the interior apertured access region of the induction heater is sized such that it can be slid down over the outer circumference of the mounted target body shown in FIG. 12 with suitable clearance (as the induction heating is a non-contact heating process, at least relative to conductive material positioned within the induction heater's aperture), but not too great a clearance as to degrade induction heating capability or efficiency. This circumferential spacing also provides for relative adjustment when it is the target body (target assembly) being moved relative to the induction heater. Under either scenario, the above described potential multi-wrap embodiments are taken in consideration relative to maintaining the non-contact induction heating properly.

Once the induction heater is properly circumferentially positioned (sharing a common same horizontal cross section height as the to-be-heated target body) about the target body, the induction heater can be energized to a desired level, and when the desired temperature is reached (e.g., 165 to 220° C.), and there is a suitable heated environment in the circumferential gap region (and the wetting material if present, is in the desired (e.g., softened state), the "gap filler" bonding material as in a "gap filler" metal solder can be introduced. The introduction is carried out in a desired fashion as by way of a pouring as depicted in FIG. 6A, and preferably coupled with bubble removal by agitation. For example, a metal solder as in Indium can be spooned (or otherwise poured) into the gap and agitation can be used to help free oxide and bubbles from the bonding surface.

Once the desired heat level in the gap region is generated by the induction heater (and CW if present) and the wetting material (if present) is sufficiently softened, the pouring in of the gap filling bonding material BM can be completed. Upon adjusting in position the heat supply relationship or shutting down of the heat supply, the target body and backing tube begin or become bonded or attached together following sufficient cooling in the pertinent gap region.

In the embodiment illustrated in FIGS. 12 to 14 there is seen that the induction heater is axially adjusted in position relative to a stationary backing tube (e.g., a backing tube telescopically and fixedly received by an upstanding base support inserted stub extension) in a manner that allows for precision control of the axial cooling/heating temperature gradient along the length of the target body. In this way, the prior treated target body can be at a desirable state of cooling or lower heating level prior to the next target segment positioning on the backing tube (preferably with an intermediate spacer such as the aforementioned silicon spacing ring). In this way, an operator also has an access opportunity, before initiation of the bonding procedure for the next in line target body, to visual confirm, for example, that there has been no cracking of the treated target segment (as in following removal of the conductive wrap on that target body, but typically without a need to remove the protective wrap, if present, due to its thinness and/or translucent or generally transparent characteristic even after heating), and no issues with bonding material leakage, etc. Also, following that step, the relative position of the induction heater, the first target body (or target body assembly in its present state) or both, can be adjusted so that the induction heater initiates heating of the second stacked target body (e.g., noting also that in embodiments of the present invention the induction heater can straddle the two target bodies initially). Also, rather than adjusting the induction heater along the axial direction (or heaters if multiple IH's are utilized), the target body(ies) can be adjusted relative to the IH (in this way a fixed bonding material supply location can be provided in that the induction heater can be retained stationary at a certain horizontal plane and the upper region of the circumferential gap to be filled can be adjusted to a desired plane based on that fixed positioning of the induction heater and the gap filling bonding application can be provided at a suitably accessible single location—visually and physically—as when monitoring the gap filling to confirm proper molten solder gap travel and bubble removal.

FIG. 13 (which represents an induction heater adjustment embodiment) illustrates the addition of a second target body cylinder or target segment on the backing tube above the lower, first positioned target body, prior to induction heater repositioning away from the first target segment. Under embodiments of the present invention, there can be provided an axial gap spacing ring between respective stacked targets to provide a desired degree of separation to accommodate expansion during usage, which spacing ring is put in position prior to the second target body stacking on the first target body.

FIG. 14 illustrates the arrangement of FIG. 13 but with the induction heater having been repositioned for focused induction heating of the second target body.

The position and bond setting by way of (preferably individualized target body) induction heating is completed in series until the desired number of target bodies are bonded to the target tube whereupon a completed target assembly such as that illustrated in FIG. 15 is attained. That is, FIG. 15 illustrates multiple bonded target bodies on a common backing tube to provide a sputtering target assembly, and with the target assembly having been separated from the induction heater. Also, under the present invention, there is little post bonding requirements as in only having to clean the axial gaps (if needed) and removal of any removable axial spacers (unless no (or permanent) target segment spacers are utilized). Further, there need only be removed the CW wrap and retainer means T2 if used (if each was not earlier removed in a target body inspection process) prior to sending the manufactured sputtering target assembly to the next location, without concern for additional contamination in situations where the protective (bonding stage) wrap is not removed and retained as a packaging protective material. That is, the protective wrap and any tape T1 utilized are designed to withstand the heat associated with the heated attachment process and be suitable for continued protective use following completion of the bonding process.

Examples 1 and 2

Example 1

In Example 1, the steps A to D of the above description of the bonding method have been applied on a $LiCoO_2$ target (hereunder called LICO target) to be bonded on a titanium backing tube.

LICO Target Manufacturing

The LICO target to be bounded is synthetized as such: 14 liters of deionized water are introduced into a polyethylene batch tank. 1.2 kg of a synthetic polyelectrolyte commonly used as a dispersing agent is added to the water and mixed. The pH of the mixture is adjusted to 10+/−0.5 by dropwise addition of concentrated $NH_4OH$ solution (~25 wt %).

60 kg of Cellcore® D5 lithium cobalt oxide powder (supplied by RBM, Rechargeable Battery Materials, a business unit of the Applicant Umicore) is slowly added to the aqueous solution with mixing.

The mixing tank is attached to the inlet and outlet tubing of a Buehler Mill and the mixture wet milled for approximately 4 hours (equipment settings). Samples are collected every hour with a target d50 value of 0.5 micron, as determined by a CPS Disc Centrifuge (Model DC 12000). During the milling process, n-octanol is added as an antifoam agent.

The above described milling of Cellcore® D5 lithium cobalt oxide powder gives rise to a bimodal particle size distribution, as shown in FIG. 3.

When the milling is complete, the resulting slip is transferred to a mixing tank where 927 g (2 wt %) of a polyvinylalcohol based binder. This mixture is stirred overnight (~14 hours).

Granulate is prepared by spray drying the resultant slip in a GEA Production Minor spray tower. The spraying was carried out at a pump rate of 25 rpm (Watson Marlow 520U Pump) yielding a throughput of 10-12 kg/hr using a fountain style spray nozzle. Inlet and outlet temperatures are controlled at 225 and 120° C. These conditions minimized losses to the cyclone to less than 30%. The granulate was characterized by particle size (d50=60-100 micron as determined by sieve analysis), angle of repose (0.3-0.5; PTL V36.61; ISO 4324), tap density (1.3-2.0 $g/cm^3$; Erweka SVM-202); JEL Stampfvolumeter STAV 2003), and residual moisture (<2%; OHaus MB45 Moisture Analyzer).

The main granulate fraction and fines were combined and blended before loading into the rubber bags of cylindrical CIP molds equipped with centrally-positioned cylindrical aluminum cores and top and bottom polyurethane retainers. Following sealing with a rubber cap and evacuation, the molds were exposed to 4000 bar of hydrostatic force.

Following removal from the rubber bag and extraction of the core, hollow cylindrical green bodies of $LiCoO_2$ were obtained with dimensions of approximately 181 to 184 mm OD, 143 to 145 mm ID, and 315 to 320 mm length.

For these samples, green machining to true up the outer peripheral surface dimensions and square the end faces was not performed. Instead, any sharp edges were removed with a blade. The green bodies were then placed in a sintering furnace equipped with a blower and damper. Debinding and sintering was carried out in a single cycle at atmospheric pressure in a (box) furnace, with the blower on and damper open only during the debinding stage (T</=500° C.) and final cool down (T</=600° C.).

The step of heating so as to remove the binder is performed, preferably continuously, at a first temperature superior or equal to 150° C. and inferior or equal to 600° C., and wherein the sintering step is performed, preferably continuously, at a second temperature that is superior to the first temperature and inferior or equal to 1100° C., more preferably inferior or equal to 1050° C., said second temperature of sintering being preferably superior to 600° C. More preferably, the heating step and the sintering steps are preformed continuously and consecutively, involving a continuous transition between the heating and sintering steps, in such a way there is no interruption and decrease of the temperature that occur during the smooth transition from the heating step to the sintering step.

Following sintering, the density of the cylinders was determined by an Archimedes' method, however, because of the porosity of the $LiCoO_2$ surface, the exterior surfaces were first coated with a polymer coating of known mass and density (PlastiDip rubber spray). Densities ranged from 4.65 to 4.70 $g/cm^3$ (Theoretical density=5.16 $g/cm^3$)

Sintered dimensions ranged from 165 to 173 mm in OD, 130 to 136 mm in ID, and 285 to 295 mm in length.

The sintered cylinders were machined to final dimensions (with roughness Ra tested to confirm the roughness value for the ID and OD was below 3.0 Ra).

LICO Target Bonding on the Titanium Backing Tube

Steps A to D of the above description of the bonding method have been applied on a $LiCoO_2$ target.

In this process of bonding the LICO target, the step D is performed at workable frequencies comprised between 1 to 100 kHz, and preferably 1 to 20 KHz, including said values.

More preferably, the frequencies range is between 6 to 12 kHz, including said values.

In Example 1, the induction generator used in the induction bonding method is arranged to work under a power level comprised between 1 to 20 kW, and preferably 1 to 10 kW, including said values.

More preferably, the power range is between 1 to 3 kW, including said values.

Example 2

In Example 2, steps A to D of the above description of the bonding method have been applied on an ITO (indium tin oxide; Indium oxide 90 wt %:Tin Oxide 10 wt %) target.

Not that when bonding ITO, the presence of the conductive wrap is not required, as ITO is an electrically conductive material.

In this process of bonding the ITO target, the step D is performed at workable frequencies comprised between 1 to 100 kHz, and preferably 1 to 20 KHz, including said values.

More preferably, the frequencies range is between 6 to 12 kHz, including said values.

In Example 2, the induction generator used in the induction bonding method is arranged to work under a power level comprised between 1 to 20 kW, and preferably 1 to 10 kW, including said values.

More preferably, the power range is between 2 to 4 kW, including said values.

The range selection of frequency and power is dependent on the geometrical (for instance, length and width of the target, length and width of the backing tube, etc.) and material properties (for instance backing tube material, target material, conductive wrap material, etc.) of the assembly target+backing tube and are modulated in such a way that bonding described herein is effective.

Although the present invention has been described in terms of the presently preferred embodiments, it is to be understood that such disclosure is not to be interpreted as limiting. Various alterations and modifications will no doubt become apparent to those skilled in the art after having read the above disclosure.

The invention claimed is:

1. A method of forming a rotary sputtering target comprising the steps of:
providing a heat- and electrically-conductive material-based backing tube presenting an inner diameter, an outer diameter and a longitudinal axis, said backing tube having an outer diameter surface defined around said longitudinal axis of the backing tube;
providing a first hollow cylindrical target body having an inner diameter, an outer diameter and a longitudinal axis, around said longitudinal axis of the first hollow cylindrical target body are defined an inner diameter surface and an outer diameter surface, said first hollow cylindrical target body comprising an electrically conductive material and thereby being an electrically conductor body;
providing an induction heater having an inner diameter;
at least partially, preferably fully, coating said inner diameter surface of the first hollow cylindrical target body with a soldering material such as an indium-based material so to form a wetted inner diameter surface of the first hollow cylindrical target body;
at least partially, preferably fully, coating said outer diameter surface of the backing tube with a soldering material such as an indium-based material so to form a wetted outer diameter surface of the backing tube;
positioning the backing tube vertically and coaxially within the inner diameter of the first hollow cylindrical target body, so as to have the longitudinal axis of the first cylindrical target body being substantially parallel to the longitudinal axis of the backing tube, and forming thereby a first assembly made of a first portion of the backing tube with its outer diameter surface being wetted and the first hollow cylindrical target body having its inner diameter surface being wetted, said first assembly having a longitudinal axis and presenting a first gap formed between the wetted outer diameter surface of the first portion of the backing tube and the wetted inner diameter surface of the first hollow cylindrical target body, said first gap being defined around said longitudinal axis of the first assembly, said first assembly having a top open end access and a bottom open end access to said first intermediate gap, respectively positioned at a first and second extremities of the first assembly, said first and second extremities of the first assembly being opposed to each other;
positioning the first assembly internally within the inner diameter of the induction heater;

pre-heating with the induction heater the first hollow cylindrical target body, or the first hollow cylindrical target body and the first portion of the backing tube, of the first assembly at a first temperature that is kept sufficient to maintain under a molten-phase a soldering material to be poured, through the top open end access, in said first gap so as to fill said first gap, said first temperature being preferably superior or equal to 180° C., more preferably superior or equal to 190° C.;

filling, through the top open end access of the first assembly, the first gap with a soldering material under its molten-phase, such as a molten indium-based material, between the wetted inner diameter surface of the first hollow cylindrical target body and the wetted outer diameter surface of the first portion of the backing tube; and heating with the induction heater said first hollow cylindrical target body, or said first hollow cylindrical target body and the first portion of the backing tube, of the first assembly along the longitudinal axis of the first assembly, such that a first axial positive gradient temperature is created from the bottom open end to the top open end of the first assembly, said axial positive gradient temperature being displaced from the bottom to the top open end accesses of the first assembly along the longitudinal axis of the first assembly, said axial gradient being oriented longitudinally, so as to induce a cooling of the soldering material in the first gap, from the bottom to the top open end accesses, and creating a bond, from the bottom to the top open end accesses, between the inner diameter surface of the first hollow cylindrical target body and the outer diameter surface of the first portion of the backing tube, thereby forming said rotary sputtering target.

2. The method of forming a rotary sputtering target according to claim 1, comprising an additional step of:
at least partially, preferably fully, covering the outer diameter surface of the first hollow cylindrical target body with a first protective material removably connected to said outer diameter surface of the first hollow cylindrical target body, said step of at least partially covering of the outer diameter surface of the first hollow cylindrical target being performed before the step of filling the first gap with a soldering material, preferably, the step of at least partially covering of the outer diameter surface of the first hollow cylindrical target body by said first protective material is performed before the step of coating the inner diameter surface of the first hollow cylindrical target body with a soldering material.

3. The method of forming a rotary sputtering target according to claim 1, wherein the backing tube is rotated and/or oscillated along its longitudinal axis during the pre-heating step and/or during the heating step.

4. The method of forming a rotary sputtering target according claim 1, comprising, prior to the step of filling the first gap with a molted soldering material, a step of covering the bottom open end access of the first assembly with a covering means such as a seal, preferably a rubber seal.

5. The method of forming a rotary sputtering target according to claim 4, comprising, after the step of heating, a step of removing said covering means from the bottom open end of the first assembly.

6. The method of forming a rotary sputtering target according to claim 1, comprising the steps of:
providing at least a second electrically conductive hollow cylindrical target body having an inner diameter, an outer diameter and a longitudinal axis, an inner diameter surface and an outer diameter surface are defined around said longitudinal axis of the second hollow cylindrical target body, said second hollow cylindrical target body consisting of an electrically conductive material;

at least partially, preferably fully, coating said inner diameter surface of the second hollow cylindrical target body with a soldering material such as an indium-based material so to form a wetted inner diameter surface of the second hollow cylindrical target body;

keeping positioning or positioning the backing tube, on which the first hollow cylindrical target is bonded, vertically and coaxially within the inner diameter of the second hollow cylindrical target body so as to have the longitudinal axis of the second cylindrical target body being substantially parallel to the longitudinal axis of the backing tube, and forming thereby a second assembly made of the second hollow cylindrical target body having said its inner diameter surface being wetted and a second portion of the backing tube having a wetted outer diameter surface being at least partially, preferably fully, coated with a soldering material, said second portion being separated from the first portion by a predetermined separation distance, said second assembly having a longitudinal axis and a second gap formed between the wetted outer diameter surface of the second portion of the backing tube and the wetted inner diameter surface of the second hollow cylindrical target body, said second gap being defined around said longitudinal axis of the second assembly, said second assembly having a top and bottom open end accesses to said second gap, respectively positioned at a first and second extremities of the second assembly, said first and second extremities of the second assembly being opposed to each other, positioning the second assembly internally within the inner diameter of the induction heater;

pre-heating with the induction heater the second hollow cylindrical target body, or the second hollow cylindrical target body and the second portion of the backing tube, of the second assembly at a second temperature that is kept sufficient to maintain under a molten-phase a soldering material to be poured, through the top open end access, in said second gap so as to fill said second gap, said second temperature being preferably superior or equal to 180° C., more preferably superior or equal to 190° C.;

filling, through the top open end access of the second assembly, the second gap with a soldering material under its molten-phase, such as a molten indium-based material, between the wetted inner diameter surface of the second hollow cylindrical target body and the wetted outer diameter surface of the second portion of the backing tube; and heating with the induction heater said second hollow cylindrical target body, or said second hollow cylindrical target body and the second portion of the backing tube, of the second assembly along the longitudinal axis of the second assembly, such that a second axial temperature positive gradient is created from the bottom open end to the top open end of the second assembly, said second axial positive gradient being displaced from the bottom to the open end accesses of the second assembly along the longitudinal axis of the second assembly, said second axial positive gradient being oriented longitudinally, so as to induce a cooling of the soldering material in the second gap, from the bottom to the top open end accesses, and thereby creating a bond, from the bottom to the top open end accesses, between the inner diameter surface of the second hollow cylindrical target body and the outer diameter surface of the second portion of the backing tube, so as to form a rotary sputtering target having at least two cylindrical hollow target bodies bonded on the backing tube.

7. The method of forming a rotary sputtering target according to claim 6, comprising an additional step of:
at least partially, preferably fully, covering the outer diameter surface of the second hollow cylindrical target body with a second protective material such as a protective film or wrap, preferably with a removable and non-adhesive film or wrap, more preferably with a polyimide-based film or polyimide-based wrap, said second protective material, being preferably self-adhering, said second protective material is removably connected to said outer diameter surface of the second hollow cylindrical target, preferably by a retention means maintaining said second protective material on the outer diameter surface of the second hollow cylindrical target body, said step of at least partially covering of the outer diameter surface of the second hollow cylindrical target being performed before the step of filling the second gap with a soldering material, preferably, the step of at least partially covering of the outer diameter surface of the second hollow cylindrical target body is performed before the step of coating the inner diameter surface of the second hollow cylindrical target body with a soldering material.

8. The method of forming a rotary sputtering target according to claim 6, wherein the backing tube is rotated and/or oscillated along its longitudinal axis during the pre-heating step and/or the heating step.

9. The method of forming a rotary sputtering target according to claim 6, comprising, prior to the step of filling the second gap with a soldering material, a step of covering the bottom open end access of the second assembly with a covering means such as a seal, preferably a rubber seal.

10. The method of forming a rotary sputtering target according to claim 9, comprising, after the step of heating, a step of removing said covering means from the bottom open end of the second assembly.

11. The method of forming a rotary target according to claim 6, wherein any of the steps therein are repeated so as to form a rotary sputtering target presenting at least three target bodies bonded on said backing tube, preferably three to five target bodies bonded on said backing tube.

12. The method of forming a rotary target according to claim 1, comprising a step of selecting a first and/or a second cylindrical hollow target body that comprises a conductive material chosen from the group consisting of: gallium aluminum zinc oxide (GAZO), gallium indium tin oxide (GITO), indium gallium zinc oxide (IGZO), indium zinc oxide (IZO), doped-SnO2, antimony tin oxide (ATO), ITO, AZO, silicon, and B-doped silicon.

13. The method of forming a rotary target according to claim 1, comprising a step of selecting a backing tube that comprises, preferably that is constituted of, an electrically conductive material chosen from the group consisting of: molybdenum, stainless steel, titanium, aluminum, and copper, or any alloys of said materials.

14. The method of forming a rotary target according to claim 13, comprising a step of selecting a backing tube that is constituted of titanium or any alloys of titanium.

15. A method of forming a rotary sputtering target comprising the steps of:
providing a heat-conductive and electrically-conductive material-based backing tube presenting an outer diameter and an outer diameter surface;
providing a first hollow cylindrical target body having an inner diameter, an outer diameter, and a longitudinal axis around which an inner diameter surface and an outer diameter surface are defined, said first hollow cylindrical target body comprising a low electrically conductive material and thereby being a low electrically conductor body;
providing an induction heater having an inner diameter and an inner diameter surface;
at least partially, preferably fully, coating said inner diameter surface of the first hollow cylindrical target body with a soldering material such as an indium-based material so to form a wetted inner diameter surface of the first cylindrical hollow target body;
at least partially, preferably fully, coating said outer diameter surface of the backing tube with a soldering material such as an indium-based material so to form a wetted outer diameter surface of the backing tube;
positioning the backing tube vertically and coaxially within the inner diameter of the first hollow cylindrical target body, so as to have the longitudinal axis of the first cylindrical target body being substantially parallel to the longitudinal axis of the backing tube, and forming thereby a first assembly made of a first portion the backing tube with its outer diameter surface being wetted and the first hollow cylindrical target body having its inner diameter surface being wetted, said first assembly having a longitudinal axis and presenting a first gap formed between the wetted outer diameter surface of the first portion of the backing tube and the wetted inner diameter surface of the first hollow cylindrical target body, said first gap being defined around said longitudinal axis, said first assembly having a top open end access and a bottom open end access to said first intermediate gap, respectively positioned at a first and second extremities of the first assembly, said first and second extremities of the first assembly being opposed to each other;
at least partially, preferably fully, covering the outer diameter surface of the first hollow cylindrical target body with a first electrically conductive material such as an electrically conductive film or an electrically conductive wrap, preferably with a removable and non-adhesive conductive film or wrap, more preferably with a carbon-based electrically conductive film or carbon-based electrically conductive wrap, said first electrically conductive material being removably connected to said outer diameter surface of the first hollow cylindrical target body by a retention means or said first electrically conductive material being self-adhering to said outer diameter surface of the first hollow cylindrical target body;
positioning the first assembly internally within the inner diameter of the induction heater, such that said first electrically conductive material is placed between said outer diameter surface of the first hollow cylindrical target body and said inner diameter of said induction heater;
pre-heating with the induction heater, through the presence of the first electrically conductive material, the first hollow cylindrical target body, or the first hollow cylindrical target body and the first portion of the backing tube, of the first assembly at a first temperature that is kept sufficient to maintain under a molten-phase a soldering material to be poured in said first gap so as to fill said first gap, said first temperature being preferably superior or equal to 180° C., more preferably superior or equal to 190° C.;

filling, through the top open end access of the first assembly, the first gap with a soldering material under its molten-phase, such as a molten indium-based material, between the wetted inner diameter surface of the first hollow cylindrical target body and the wetted outer diameter surface of the first portion of the backing tube; and heating with the induction heater, through the presence of the first electrically conductive material, said first hollow cylindrical target body, or said first hollow cylindrical target body and the first portion of the backing tube, of the first assembly along the longitudinal axis of the first assembly, such that a first axial temperature gradient is created from the bottom open end to the top open end of the first assembly, said first axial temperature gradient being a positive gradient, said positive axial gradient being displaced from the bottom to the open end accesses of the first assembly, along the longitudinal axis of the first assembly, said axial gradient being oriented longitudinally, so as to induce a cooling of the soldering material in the first gap, from the bottom to the top open end accesses, and thereby creating a bond, from the bottom to the top open end accesses, between the inner diameter surface of the first hollow cylindrical target body and the outer diameter surface of the first portion of the backing tube, so as to form said rotary sputtering target.

16. The method of forming a rotary sputtering target according to claim 15, comprising, prior the step of covering the outer diameter surface of the first hollow cylindrical target body with a first electrically conductive material, an additional step of:

at least partially, preferably fully, covering the outer diameter surface of the first hollow cylindrical target body with a first protective material such as a protective film or a protective wrap, preferably with a removable and non-adhesive film or wrap, more preferably with a polyimide-based film or polyimide-based wrap, said first protective material being removably connected to said outer diameter surface of the first hollow cylindrical target body by a retention means or said first protective material being self-adhering to the outer diameter surface of the first hollow cylindrical target body, said step of at least partially covering of the outer diameter surface of the first hollow cylindrical target being performed before the step of filling the first gap with a soldering material, preferably, the step of at least partially covering of the outer diameter surface of the first hollow cylindrical target body is performed before the step of coating the inner diameter surface of the first hollow cylindrical target body with a soldering material.

17. The method of forming a rotary sputtering target according to claim 15, wherein the backing tube is rotated and/or oscillated along its longitudinal axis during the pre-heating step and/or the heating step.

18. The method of forming a rotary sputtering target according to claim 15, comprising, prior to the step of filling the first gap with a molted soldering material, a step of covering the bottom open end access of the first assembly with a covering means such as a seal, preferably a rubber seal.

19. The method of forming a rotary sputtering target according to claim 18, comprising, after the step of heating, a step of removing said covering means from the bottom open end of the first assembly.

20. The method of forming a rotary sputtering target according to claim 15, comprising, after the step of heating, a step of removing said first conductive material, preferably followed by a step of removing said first protective material.

21. Method of forming a rotary sputtering target according to claim 15, comprising the steps of:

providing at least a second hollow cylindrical target body having an inner diameter; an outer diameter; and a longitudinal axis around which an inner diameter surface and an outer diameter surface are defined, said second hollow cylindrical target body consisting of or comprising a low electrically conductive material;

at least partially, preferably fully, coating said inner diameter surface of the second hollow cylindrical target body with a soldering material such as an indium-based material so to form a wetted inner diameter surface of the second hollow cylindrical target body;

keeping positioning or positioning the backing tube, on which the second hollow cylindrical target has been bonded, vertically and coaxially within the inner diameter of the second hollow cylindrical target body so as to have the longitudinal axis of the second cylindrical target body being substantially parallel to the longitudinal axis of the backing tube, and forming thereby a second assembly made of the second hollow cylindrical target body having said its inner diameter surface being wetted and a second portion of the backing tube having a wetted outer diameter surface being at least partially, preferably fully, coated with a soldering material, said second portion being separated from the first portion by a predetermined separation distance, said second assembly having a longitudinal axis and a second gap formed between the wetted outer diameter surface of the second portion of the backing tube and the wetted inner diameter surface of the second hollow cylindrical target body, said second gap being defined around said longitudinal axis, said second assembly having a top and bottom open end accesses to said second gap, respectively positioned at a first and second extremities of the second assembly, said first and second extremities of the second assembly being opposed to each other;

at least partially, preferably fully, covering the outer diameter surface of the second hollow cylindrical target body with a second electrically conductive material such as an electrically conductive film or an electrically conductive wrap, preferably with a removable and non-adhesive conductive film or wrap, more preferably with a carbon-based electrically conductive film or carbon-based electrically conductive wrap, said second electrically conductive material being removably connected to said outer diameter surface by a retention means or said second electrically conductive material being self-adhering to said outer diameter surface of the second hollow cylindrical target body;

positioning the second assembly internally within the inner diameter of the induction heater such that said second electrically conductive material is placed between said outer diameter surface of the second hollow cylindrical target body and said inner diameter surface of said induction heater;

pre-heating with the induction heater, through the presence of the second electrically conductive material, the second hollow cylindrical target body, or the second hollow cylindrical target body and the second portion of the backing tube, at a second temperature that is kept sufficient to maintain under a molten-phase a soldering material to be poured in said second gap so as to fill said second gap, said second temperature being preferably superior or equal to 180° C., more preferably superior or equal to 190° C.;

filling, through the top open end access of the second assembly, the second gap with a soldering material under its molten-phase, such as a molten indium-based material, between the wetted inner diameter surface of the second hollow cylindrical target body and the wetted outer diameter surface of the second portion of the backing tube; and heating with the induction heater, through the presence of the second electrically conductive material, said second hollow cylindrical target body, or said second hollow cylindrical target body and the second portion of the backing tube, of the second assembly along the longitudinal axis of the second assembly, such that a second axial temperature positive gradient is created from the bottom open end to the top open end of the second assembly, said second axial positive gradient being displaced from the bottom to the open end accesses of the second assembly along the longitudinal axis of the second assembly, said axial gradient being oriented longitudinally, so as to induce a cooling of the soldering material in the second gap, from the bottom to the top open end accesses, and thereby creating a bond, from the bottom to the top open end accesses, between the inner diameter surface of the second hollow cylindrical target body and the outer diameter surface of the second portion of the backing tube, so as to form a rotary sputtering target having at least two cylindrical hollow target bodies bonded on the backing tube.

22. The method of forming a rotary sputtering target according to claim 21, comprising, prior the step of covering the outer diameter surface of the second hollow cylindrical target body with a second electrically conductive material, an additional step of:

at least partially, preferably fully, covering the outer diameter surface of the second hollow cylindrical target body with a second protective material such as a protective film or wrap, preferably with a removable and non-adhesive film or wrap, more preferably with a polyimide-based film or polyimide-based wrap, said second protective material being removably connected to said outer diameter surface by a retention means or said second protective material being self-adhering to the outer diameter surface of the second hollow cylindrical target body, said step of at least partially covering of the outer diameter surface of the second hollow cylindrical target being performed before the step of filling the second gap with a soldering material, preferably, the step of at least partially covering of the outer diameter surface of the second hollow cylindrical target body is performed before the step of coating the inner diameter surface of the second hollow cylindrical target body with a soldering material.

23. The method of forming a rotary sputtering target according to claim 21, wherein the backing tube is rotated and/or oscillated along its longitudinal during the pre-heating step and/or the heating step.

24. The method of forming a rotary sputtering target according to claim 21, comprising, prior to the step of filling the second gap with a soldering material, a step of covering the bottom open end access of the second assembly with a covering means such as a seal, preferably a rubber seal.

25. The method of forming a rotary sputtering target according to claim 23, comprising, after the step of heating, a step of removing said covering means from the bottom open end access of the second assembly.

26. The method of forming a rotary sputtering target according to claim 21, comprising, after the step of heating, a step of removing said second conductive material, preferably followed by a step of removing said second protective material.

27. The method of forming a rotary target according to claim 21, wherein any of the steps therein are repeated so as to form a rotary sputtering target presenting at least three target bodies bonded on said backing tube, preferably three to five target bodies bonded on said backing tube.

28. The method of forming a rotary target according to claim 15, comprising a step of selecting a first and/or a second cylindrical hollow target body that comprises a low conductive material chosen from a group consisting of: low alumina AZO, doped or undoped $Li_3PO_4$, undoped silicon, ZnO and lithium-containing transition metal oxides.

29. The method of forming a rotary target according to claim 28, wherein said lithium-containing transition metal oxide is selected so as to have a general formula: $LiMO_2$ or $LiMM'O_2$, wherein M is a transition metal selected from the group consisting of: Ni, Co, Mn, Ti, Al, V, Cr, Y, Sr, Ca, Zr, Zn, Si, Mg, Ga, W, Fe, Cu, La, or at least one combination thereof, and M' is a dopant selected from the group consisting of: Ti, Al, V, Cr, Y, Sr, Ca, Zr, Zn, Si, Mg, Ga, W, Fe, Cu, La, or at least one combination thereof.

30. The method of forming a rotary target according to claim 29, wherein the $LiMO_2$ or $LiMM'O_2$ lithium-containing transition metal oxide is selected so as to have a Li/M or Li/(M+M') atomic ratio superior or equal to 0.90 and inferior or equal to 1.25, preferably superior or equal to 0.98 and inferior or equal to 1.05.

31. The method of forming a rotary target according to claim 29, wherein the $LiMM'O_2$ lithium-containing transition metal oxide is selected so as to have a M'/M atomic ratio superior or equal to 0.001 and inferior or equal to 0.05.

32. The method of forming a rotary target according to claim 29, wherein the $LiMO_2$ lithium-containing transition metal oxide is selected so as to have a general formula: $LiCoO_2$.

33. The method of forming a rotary target according to claim 32, wherein is the $LiCoO_2$ formula is selected so as to have a Li/Co ratio is equal to 1.0+/−0.50.

34. The method of forming a rotary target according to claim 15, comprising a step of selecting a backing tube that comprise, preferably that is constituted of, an electrically conductive material chosen from the group consisting of: molybdenum, stainless steel, titanium, aluminum, and copper, or any alloys of said materials.

* * * * *